(12) United States Patent
Takenaka

(10) Patent No.: US 10,613,120 B2
(45) Date of Patent: Apr. 7, 2020

(54) CURRENT MEASUREMENT DEVICE

(71) Applicant: Yokogawa Electric Corporation, Tokyo (JP)

(72) Inventor: Kazuma Takenaka, Tokyo (JP)

(73) Assignee: Yokogawa Electric Corporation, Musashino-shi, Tokyo (JP)

( * ) Notice: Subject to any disclaimer, the term of this patent is extended or adjusted under 35 U.S.C. 154(b) by 247 days.

(21) Appl. No.: 15/793,485

(22) Filed: Oct. 25, 2017

(65) Prior Publication Data
US 2018/0120357 A1 May 3, 2018

(30) Foreign Application Priority Data
Oct. 31, 2016 (JP) .................................. 2016-213790

(51) Int. Cl.
*G01R 31/34* (2020.01)
*G01R 15/18* (2006.01)
(Continued)

(52) U.S. Cl.
CPC ........... *G01R 15/181* (2013.01); *G01R 15/18* (2013.01); *G01R 15/185* (2013.01); *G01R 15/20* (2013.01);
(Continued)

(58) Field of Classification Search
CPC .. G01R 15/207; G01R 15/185; G01R 15/202; G01R 15/148; G01R 15/20; G01R 15/205; G01R 33/09
See application file for complete search history.

(56) References Cited

U.S. PATENT DOCUMENTS 4,682,101 A 6/1987 Cattaneo
7,309,980 B2 12/2007 Mende et al.
(Continued)

FOREIGN PATENT DOCUMENTS

EP 2515123 A2 * 10/2012 ........... G01R 15/185
EP 2515123 A2 10/2012
(Continued)

OTHER PUBLICATIONS

Giant Magnetoimpedance Sensor, Hauser et al. Jun. 2001 (Year: 2001).*
(Continued)

*Primary Examiner* — Alesa Allgood
(74) *Attorney, Agent, or Firm* — Sughrue Mion, PLLC

(57) ABSTRACT

A current measurement device includes a low frequency measurement sensor configured to measure a magnetic field, a high frequency measurement sensor configured to measure the magnetic field and configured to generate a magnetic field for canceling the magnetic field applied to the low frequency measurement sensor, a magnetism sensing direction of the low frequency measurement sensor and a magnetism sensing direction of the high frequency measurement sensor being substantially parallel to each other, a negative feedback circuit configured to control a current flowing through the high frequency measurement sensor based on the magnetic field measured by the low frequency measurement sensor, a low pass filter configured to adjust a frequency characteristic of the current controlled by the negative feedback circuit, and an outputter configured to output a measurement value of the current to be measured based on the current flowing through the high frequency measurement sensor.

13 Claims, 16 Drawing Sheets

(51) Int. Cl.
*G01R 15/20* (2006.01)
*G01R 33/00* (2006.01)
*G01R 33/02* (2006.01)
*G01R 33/07* (2006.01)
*G01R 19/00* (2006.01)

(52) U.S. Cl.
CPC ....... *G01R 15/207* (2013.01); *G01R 33/0005* (2013.01); *G01R 33/0041* (2013.01); *G01R 33/02* (2013.01); *G01R 33/07* (2013.01); *G01R 15/202* (2013.01); *G01R 15/205* (2013.01); *G01R 19/0061* (2013.01); *G01R 19/0092* (2013.01)

(56) References Cited

U.S. PATENT DOCUMENTS

| | | |
|---|---|---|
| 2004/0095126 A1 | 5/2004 | Kudo et al. |
| 2004/0201373 A1 | 10/2004 | Kato |
| 2007/0114992 A1 | 5/2007 | Muniraju et al. |
| 2007/0244388 A1* | 10/2007 | Sato .................. A61B 1/00147 600/424 |
| 2007/0257661 A1 | 11/2007 | Mende et al. |
| 2009/0302837 A1 | 12/2009 | Phan Le et al. |
| 2011/0006755 A1* | 1/2011 | Younsi ................ G01R 15/185 324/127 |
| 2011/0304328 A1* | 12/2011 | Yamamoto ......... G01N 27/9033 324/240 |
| 2014/0218018 A1* | 8/2014 | Ivanov .................. G01R 33/02 324/247 |

FOREIGN PATENT DOCUMENTS

| | | | |
|---|---|---|---|
| JP | 61245511 A | | 10/1986 |
| JP | 02150775 A | | 6/1990 |
| JP | 08249615 A | * | 9/1996 |
| JP | 2004-039848 A | | 2/2004 |
| JP | 2004-257905 A | | 9/2004 |
| JP | 2014235045 A | | 12/2014 |

OTHER PUBLICATIONS

Hans Hauser, et al., "Giant Magnetoimpedance Sensors", IEEE Instrumentation & Measurement Magazine, IEEE Service Center, Piscataway, NJ, US, vol. 4, No. 2, Jun. 2001, pp. 28-32.

* cited by examiner

CURRENT MEASUREMENT DEVICE

BACKGROUND

Technical Fields

The disclosure relates to a current measurement device.

Priority is claimed on Japanese Patent Application No. 2016-213790, filed Oct. 31, 2016, the contents of which are incorporated herein by reference.

Related Art

As a current sensor for detecting a current flowing through a conductor to be measured, there is a current sensor for measuring a magnetic field generated by the current flowing through the conductor to be measured, using a magnetic sensor disposed around the conductor to be measured. A magnetic core (hereinafter, called as "magnetism collecting core") wound around the conductor to be measured may be disposed in the current sensor to improve measurement sensitivity of the magnetic sensor.

The current sensor may have a feedback coil for canceling the magnetic field applied to the magnetic sensor. The feedback coil generates a magnetic field in a direction opposite to the magnetic field applied to the magnetic sensor by a current according to an intensity of the current to be measured so that the magnetic field applied to the magnetic sensor can be canceled (for example, Japanese Unexamined Patent Application Publication No. 2004-039848).

There is a current sensor using a Rogowski coil which has an air core coil wound around the conductor to be measured and measures an alternating current to be measured based on an induced electromotive force corresponding to the current to be measured (for example, Japanese Unexamined Patent Application Publication No. 2004-257905).

However, since a shape of the magnetism collecting core used for the conventional current sensor is fixed because of a hard material such as ceramics containing iron oxide as a main component, the conventional current sensor is weak against impact, and mounting space and position of the sensor are limited. For this reason, the current sensor having the magnetism collecting core may be arranged in a narrow limited space, such as a periphery of a bus bar in which IC pins of power semiconductor and wirings are integrated, or may be difficult to be used in a vibration environment.

The current sensor using the Rogowski coil cannot measure a direct current and an alternating current of low frequency because it is used for measuring an alternating current, and it is necessary to selectively use a sensor in accordance with the frequency.

SUMMARY

A current measurement device may include a low frequency measurement sensor configured to measure a magnetic field generated by a current to be measured, a high frequency measurement sensor configured to measure the magnetic field and configured to generate a magnetic field for canceling the magnetic field applied to the low frequency measurement sensor, a magnetism sensing direction of the low frequency measurement sensor and a magnetism sensing direction of the high frequency measurement sensor being substantially parallel to each other, a negative feedback circuit configured to control a current flowing through the high frequency measurement sensor based on the magnetic field measured by the low frequency measurement sensor, a low pass filter configured to adjust a frequency characteristic of the current flowing through the high frequency measurement sensor and controlled by the negative feedback circuit, the low pass filter being disposed in the negative feedback circuit, and an outputter configured to output a measurement value of the current to be measured based on the current flowing through the high frequency measurement sensor.

Further features and aspects of the present disclosure will become apparent from the following detailed description of exemplary embodiments with reference to the attached drawings.

DETAILED DESCRIPTION OF THE EMBODIMENTS

The embodiments of the present invention will be now described herein with reference to illustrative preferred embodiments. Those skilled in the art will recognize that many alternative preferred embodiments can be accomplished using the teaching of the present invention and that the present invention is not limited to the preferred embodiments illustrated herein for explanatory purposes.

An aspect of the present invention is to provide a current measurement device which can be used in a place where installation space is limited and can measure currents over a wide range of frequency.

Hereinafter, a current measurement device in an embodiment of the present invention will be described in detail with reference to drawings.

Figure 1A:
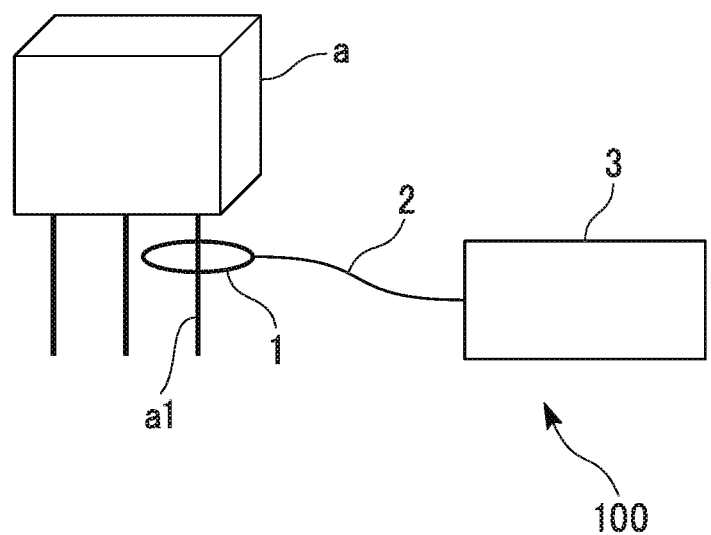
FIG. 1A is a drawing illustrating an example of the usage of the current measurement device in the embodiment.
Figure 1B:
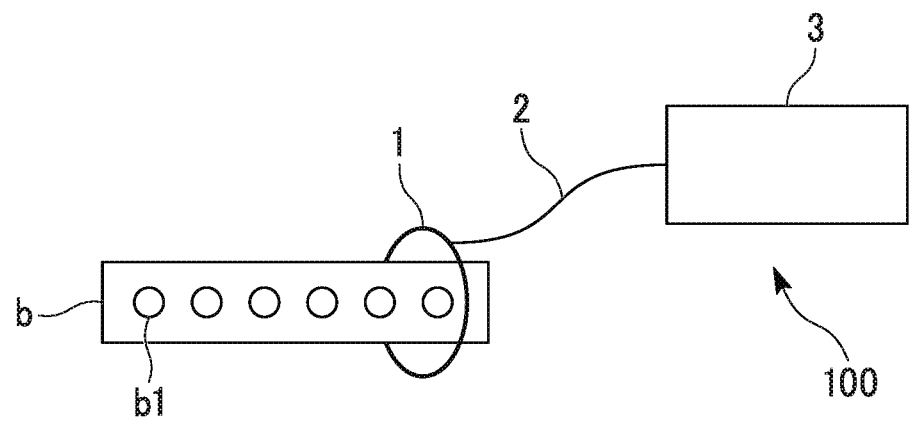
FIG. 1B is a drawing illustrating an example of the usage of the current measurement device in the embodiment.

First, a usage of the current measurement device will be described with reference to FIG. 1A and FIG. 1B. FIG. 1A and FIG. 1B are drawings illustrating an example of the usage of the current measurement device in the embodiment.

In FIG. 1A, the current measurement device 100 has a current sensor 1, a cable 2, and a circuit unit 3. The current sensor 1 detects an intensity of a magnetic field generated in accordance with an intensity of a current flowing through a conductor to be measured. The current sensor 1 outputs the intensity of the detected magnetic field as a current value or a voltage value. Details of the current sensor will be described later with reference to FIG. 2 and so on.

The current sensor 1 is a wire-like flexible sensor without a magnetism collecting core. The current sensor 1 has a loop shape and can be wound around the conductor to be measured. In FIG. 1A, the pin a1 of the power IC a is the conductor to be measured, and the current sensor 1 measures the current flowing through the pin a1. The pin a1 is arranged at a predetermined pitch from the power IC a. Therefore, the installation space of the sensor for measuring the current flowing through the pin a1 is limited in accordance with the pitch of the pin a1. Since the current sensor 1 does not have a magnetism collecting core, the current sensor 1 is not affected by a size of the magnetism collecting core. Since the magnetism collecting core is required to have a predetermined size in consideration of magnetic saturation of magnetic material, it is difficult to downsize the current sensor having the magnetism collecting core. Since the current sensor 1 is a wire-like flexible sensor without a magnetism collecting core, even if the current sensor 1 is installed for a conductor to be measured, such as the pin a1 of the power IC a, of which installation space is limited, it is possible to install the current sensor 1 wound around the pin a1. Since the current sensor 1 does not have a magnetism collecting core, a problem about hysteresis hardly occurs. A length and a thickness (diameter) of the wire of the current sensor 1 can be appropriately selected in accordance with the usage. For example, the diameter of the current sensor 1 can be selected in accordance with a pitch of the pin a1. Furthermore, since the current sensor 1 does not have a magnetism collecting core, it is not necessary to demagnetize to eliminate residual magnetization of the magnetism collecting core.

As shown in FIG. 1, the current sensor 1 is connected to the circuit unit (current measurement device body) 3 via the cable 2. However, the current sensor 1 may be directly connected to the circuit unit 3 without the cable 2. Therefore, presence or absence of the cable 2 and the length of the cable 2 can be appropriately selected in accordance with the usage. Also in the description of the following drawings, the presence or absence of the cable 2 and the length of the cable 2 may be appropriately selected. The circuit unit 3 converts the intensity of the magnetic field, which has been generated in the conductor to be measured and detected by the current sensor 1, into a current value of a current flowing through the conductor to be measured. Details of the circuit unit 3 will also be described later.

In FIG. 1B, the bus bar b is the conductor to be measured, and the current sensor 1 measures the current. For example, the bus bar b is used in such a way as to supply a large current to an integrated wiring like a case of a hybrid car. For example, a wiring connector b1 is disposed in the bus bar b at a predetermined pitch, and a wiring (not shown) is connected with high density. Therefore, in a case of measuring the current of the bus bar b, the installation space of the current sensor 1 is limited. Since the current sensor 1 is a wire-like flexible sensor without a magnetism collecting core, even if the current sensor 1 is installed for a conductor to be measured, such as the bus bar b, of which installation space is limited, it is possible to install the current sensor 1 wound around the bus bar b between the high density wirings.

Figure 2:
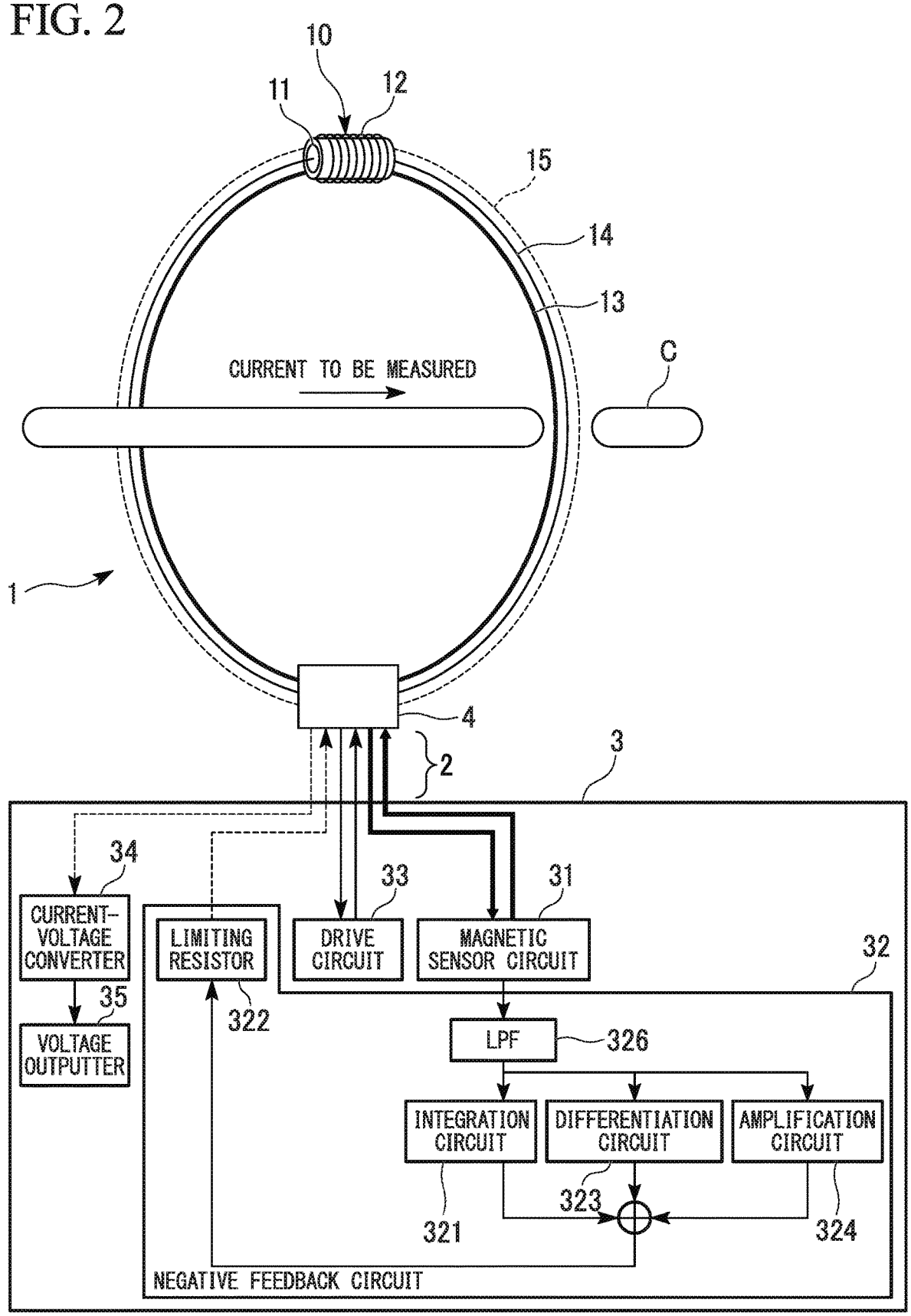
FIG. 2 is a drawing illustrating an example of the configuration of the current measurement device in the embodiment.

Next, the configuration of the current measurement device 100 will be described with reference to FIG. 2. FIG. 2 is a drawing illustrating an example of the configuration of the current measurement device in the embodiment.

As shown in FIG. 2, the current measurement device 100 includes the current sensor 1, the cable 2, the circuit unit 3, and a connector 4. The current sensor 1 has a composite sensor 10, a low frequency measurement sensor wire 13, a low frequency measurement sensor drive wire 14, and a high frequency measurement sensor wire 15. The "low frequency" and the "high frequency" in the present embodiment do not represent an absolute value of the frequency, but represents a relative frequency in a case that the frequency of the current to be measured is divided into high frequency and low frequency. The low frequency includes a direct current.

The low frequency measurement sensor wire 13, the low frequency measurement sensor drive wire 14, and the high frequency measurement sensor wire 15 included in the current sensor 1 are bundled by the same coating (not shown) to form a loop shape. In the present embodiment described below (FIG. 2 to FIG. 16), a group of wires bundled in the loop shape is called as "wire portion". The wire portion is flexible because it does not have a magnetism collecting core. Since the wire portion is flexible, even if the installation space around the conductor c is limited, the wire portion can be installed and wound around the conductor c easily.

The composite sensor 10 has a low frequency measurement sensor 11 and a high frequency measurement sensor 12. The composite sensor 10 measures the magnetic field generated by the current flowing through the conductor c using the low frequency measurement sensor 11 and the high frequency measurement sensor 12. The composite sensor 10 is disposed in a part of the loop of the wire portion, and the composite sensor 10 can measure the magnetic field generated around the conductor c when the wire portion is wound around the conductor c. In FIG. 2, the conductor c is disposed at a center of the loop of the wire portion. In a case that there is only one composite sensor 10, a jig (not shown) makes a distance between the composite sensor 10 and the conductor c constant so that the current can be accurately measured.

The low frequency measurement sensor 11 is an arbitrary type of magnetic sensor. The type of the magnetic sensor can be classified in accordance with a type of an element used for the magnetic sensor. The type of the element used for the low frequency measurement sensor is such as a magnetic resistance element, a Hall element, a flux gate element, a magnetic impedance element, and so on. The magnetic resistance (MR: Magneto Resistance) element is a sensor which detects a magnetic field by detecting a change rate of a magnetic resistance which changes in accordance with an intensity of an applied magnetic field. The magnetic resistance element is excellent in a temperature characteristic and inexpensive. The Hall element is a sensor which converts a magnetic field into an electric signal by utilizing a Hall effect. The Hall element is inexpensive, and a sensitivity and a temperature characteristic of the Hall element can be selected in accordance with used material. The flux gate element is a sensor which excites a high permeability magnetic core with an alternating current and detects a magnetic flux from the high permeability magnetic core using a pickup coil. The flux gate element is highly sensitive and excellent in linearity and a temperature characteristic. A magnetic impedance (MI: Magneto Impedance) element is a sensor which utilizes a magnetic impedance effect. The magnetic impedance element is highly sensitive and excellent in a temperature characteristic and heat resistance by using an amorphous alloy wire, and it is possible to widen a band.

The high frequency measurement sensor 12 is arranged so that a magnetism sensing direction of the low frequency measurement sensor 11 and a magnetism sensing direction of the high frequency measurement sensor 12 are parallel to each other. The magnetism sensing direction is a direction having a maximum sensitivity to a magnetic field. For example, if the high frequency measurement sensor 12 has a coil shape, the magnetism sensing direction is a direction in which an opening portion of the coil is perpendicular to a direction of the magnetic field. The magnetism sensing direction of the low frequency measurement sensor 11 and the high frequency measurement sensor 12 in FIG. 2 is a circumferential direction of the wire portion. In FIG. 2, the low frequency measurement sensor 11 has a cylindrical shape. The low frequency measurement sensor 11 and the high frequency measurement sensor 12 are arranged in a way that a central axis of the cylindrical shape, which is a magnetism sensing direction of the low frequency measurement sensor 11, is substantially the same as a central axis which is a magnetism sensing direction of the high frequency measurement sensor 12. That is, in FIG. 2, the low frequency measurement sensor 11 and the high frequency measurement sensor 12 are arranged concentrically. As shown in FIG. 2, the high frequency measurement sensor 12 is disposed so as to cover the low frequency measurement sensor 11. Details of the configuration of the low frequency measurement sensor 11 and the high frequency measurement sensor 12 will be described later with reference to FIG. 3. The frequency characteristic of the low frequency measurement sensor 11 with respect to the current to be measured is different from the frequency characteristic of the high frequency measurement sensor 12 with respect to the current to be measured. The low frequency measurement sensor 11 is a sensor having high sensitivity in direct current and low frequency band. On the other hand, the high frequency measurement sensor 12 is a sensor having higher sensitivity in high frequency band than the low frequency measurement sensor 11. As an example, in the present embodiment, the high frequency measurement sensor 12 is a Rogowski coil installed so that a magnetic flux generated when a current to be measured flows through the conductor c passes through the coil. The Rogowski coil is a coil in which an air core coil is annular, and can be used for measuring an alternating current. In the high frequency measurement sensor 12 shown in FIG. 2, a part of the annular coil is used as a coil, and the other part is used as a wire portion. By this configuration, since an inductance and stray capacitance of the coil can be reduced, a resonance point can be increased, and as the result, the measurement range can be expanded. By combining the low frequency measurement sensor 11 and the high frequency measurement sensor 12, it is possible to measure the current to be measured at a wide range of frequency. Details of frequency characteristic of the sensitivities of the low frequency measurement sensor 11 and the high frequency measurement sensor 12 will be described later with reference to FIG. 4A and FIG. 4B.

A drive current or a drive voltage is supplied to the low frequency measurement sensor 11 via the low frequency measurement sensor drive wire 14 in order to drive the low frequency measurement sensor 11. The driven low frequency measurement sensor 11 outputs, via the low frequency measurement sensor wire 13, a signal corresponding to an intensity of the magnetic field generated by the current flowing through the conductor c. The low frequency measurement sensor wire 13 and the low frequency measurement sensor drive wire 14 operate differently depending on a type of the element used for the low frequency measurement sensor 11. The type of the element used for the low frequency measurement sensor 11 is such as a magnetic resistance element, a Hall element, a flux gate element, a magnetic impedance element, and so on. The configuration of the composite sensor 10 depending on the type of the element will be described later.

The connector 4 connects the wire portion (the low frequency measurement sensor wire 13, the low frequency measurement sensor drive wire 14, and the high frequency measurement sensor wire 15 of the current sensor 1) to the current sensor 1 via the cable 2. The connector 4 includes two blocks (not shown). One block of the connector 4 is always connected to the cable 2. On the other hand, the other block of the connector 4 is connected to the cable 2 when it is inserted to the one block, and the other block of the connector 4 is disconnected from the cable 2 when it is pulled out from the one block. By connecting the both ends of the wire portion to the blocks of the connector 4 respectively, it is possible to connect and disconnect one end of the wire portion and the cable 2 by inserting and pulling out the connector 4. In other words, after the wire portion is wound around the conductor c in a state where the connector 4 is pulled out, the connector 4 is inserted to form a loop. As described above, the connector 4 can connect the current sensor 1 directly to the circuit unit 3 without the cable 2.

The circuit unit 3 includes a magnetic sensor circuit 31, a negative feedback circuit 32, a drive circuit 33, a current-voltage converter 34, and an outputter (voltage outputter) 35. The negative feedback circuit 32 includes an integration circuit 321, a limiting resistor 322, a differentiation circuit 323, an amplification circuit 324, and a low pass filter (LPF) 326. The magnetic sensor circuit 31 is connected to the low frequency measurement sensor wire 13 via the cable 2. The magnetic sensor circuit 31 processes a signal output from the low frequency measurement sensor 11, and outputs it to the negative feedback circuit 32. For example, the magnetic sensor circuit 31 is an amplification circuit which amplifies a signal output from the low frequency measurement sensor 11. The drive circuit 33 supplies a drive power (current or voltage) to the low frequency measurement sensor 11 via the low frequency measurement sensor drive wire 14.

The negative feedback circuit 32 controls the output from the low frequency measurement sensor 11, and supplies a current corresponding to the output from the low frequency measurement sensor 11 to the high frequency measurement sensor 12 via the high frequency measurement sensor wire 15. The high frequency measurement sensor 12 generates, based on the current output from the negative feedback circuit 32, a magnetic field in a direction in which the magnetic field applied to the low frequency measurement sensor 11 is canceled. The negative feedback circuit 32 performs negative feedback control for outputting a feedback current to the high frequency measurement sensor 12 so that the output from the low frequency measurement sensor 11 becomes zero. In other words, the high frequency measurement sensor 12 operates as a feedback coil for measuring the magnetic field of the conductor c, and for generating a magnetic field which cancels the magnetic field applied to the low frequency measurement sensor 11 based on the current generated in accordance with the intensity of the magnetic field measured by the low frequency measurement sensor 11. As described above, in a band of direct current or low frequency, the sensitivity of the low frequency measurement sensor 11 is high, and the sensitivity of the high frequency measurement sensor 12 is low. For this reason, in the band of direct current or low frequency, the high frequency measurement sensor 12 mainly operates as a feedback coil. On the other hand, in a high frequency band, the sensitivity of the low frequency measurement sensor 11 is low, and the sensitivity of the high frequency measurement sensor 12 is high. Therefore, in the high frequency band, the high frequency measurement sensor 12 mainly operates as a Rogowski coil. The current sensor 1 of the present embodiment detects an output signal as a current from the feedback coil. In a current sensing using the low frequency measurement sensor 11 and the high frequency measurement sensor 12 as feedback coils, the current flowing through the feedback coil is controlled so as to make zero flux. In a current sensing using the high frequency measurement sensor 12 as a Rogowski coil, an induced current is generated in a direction hindering the magnetic field applied to the high frequency measurement sensor 12. For this reason, in both of the above two methods, it is controlled so that the applied magnetic field in the coil of the high frequency measurement sensor 12 becomes zero, and a signal can be detected in accordance with only the output current from the high frequency measurement sensor 12. Therefore, it is not necessary to additionally provide an adjustment circuit for adjusting the sensitivity of the low frequency measurement sensor 11 and the sensitivity of the high frequency measurement sensor 12 and an addition circuit for adding outputs from them.

The integration circuit 321, the differentiation circuit 323, and the amplification circuit 324 of the negative feedback circuit 32 respectively integrate, differentiate, and amplify the voltage value according to the intensity of the magnetic field of the conductor c measured by the low frequency measurement sensor 11 to perform a PID (Proportional-Integral-Differential) control, and to convert it into a current value. The limiting resistor 322 is included in the negative feedback circuit 32 together with the amplification circuit 324, the differentiation circuit 323, and the integration circuit 321. The limiting resistor 322 feeds, back to the high frequency measurement sensor 12, the current value output from the amplification circuit 324, the differentiation circuit 323, and the integration circuit 321. The negative feedback circuit 32 may control the voltage value by using at least one of the integration circuit 321, the differentiation circuit 323, and the amplification circuit 324. By adding measurement values measured by a plurality of circuits, it is possible to improve the detection accuracy.

The current-voltage converter 34 converts, into a voltage, the current flowing to the high frequency measurement sensor 12 via the high frequency measurement sensor wire 15. The voltage outputter 35 outputs the voltage converted by the current-voltage converter 34 to the outside of the circuit unit 3 as a measurement value of the current to be measured of the conductor c. For example, the voltage outputter 35 outputs a current value in a predetermined range as a voltage in a range from 0 [V] to 5 [V].

The low pass filter 326 is disposed in the negative feedback circuit 32. For example, the low pass filter 326 is inserted between the magnetic sensor circuit 31 which processes the output of the low frequency measurement sensor 11 and the three circuits (the integration circuit 321, the differentiation circuit 323, and the amplification circuit 324). In other words, the low pass filter 326 is connected to the low frequency measurement sensor 11 via the magnetic sensor circuit 31. The low pass filter 326 blocks high-frequency components contained in the output of the magnetic sensor circuit 31 and passes low-frequency components. Thereby, it is possible to adjust the frequency characteristic of the output signal of the low frequency measurement sensor 11 using the feedback loop. The low pass filter 326 outputs the output signal of the low frequency measurement sensor 11 of which frequency characteristic has been adjusted to the integration circuit 321, the differentiation circuit 323, and the amplification circuit 324. The negative feedback circuit 32 operates the high frequency measurement sensor 12 as a feedback coil by using the output signal of the low frequency measurement sensor 11 of which frequency characteristic has been adjusted.

For example, the low pass filter 326 may be a CR type low pass filter including a capacitor (C) and a resistor (R). The low pass filter 326 may be an LC type low pass filter including a coil (L) and a capacitor (C). The low pass filter 326 may be an active low pass filter using an operational amplifier.

In FIG. 2, the low pass filter 326 is disposed in the negative feedback circuit 32, but the invention is not limited thereto. For example, the low pass filter 326 may be disposed in the magnetic sensor circuit 31 because a feedback loop is formed by the low frequency measurement sensor 11, the magnetic sensor circuit 31, the low pass filter 326, the integration circuit 321, the differentiation circuit 323, the amplification circuit 324, the limiting resistor 322, and the high frequency measurement sensor 12. In addition, also in FIG. 5 which will be described later and which illustrates an example in which a similar feedback loop is formed, the low pass filter 326 may be disposed at a position outside the negative feedback circuit 32 where a feedback loop is formed.

Figure 3:
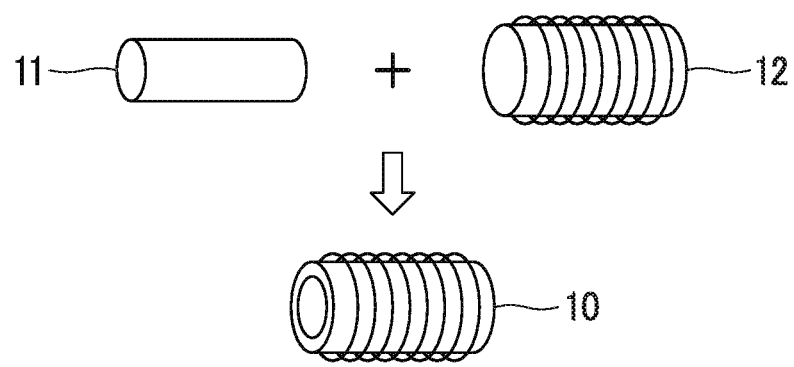
FIG. 3 is a drawing illustrating an example of the configuration of the current sensor in the embodiment.

Next, the configuration of the composite sensor 10 will be described with reference to FIG. 3. FIG. 3 is a drawing illustrating an example of the configuration of the current sensor in the embodiment.

In FIG. 3, the low frequency measurement sensor 11 is an arbitrary magnetic sensor. As described above, the low frequency measurement sensor 11 may be various types of magnetic sensors, such as a magnetic resistance element, a Hall element, a flux gate element, a magnetic impedance element, and so on. The high frequency measurement sensor 12 is arranged so that the magnetism sensing direction of the low frequency measurement sensor 11 and the magnetism sensing direction of the high frequency measurement sensor 12 are the same. The magnetism sensing direction of the low frequency measurement sensor 11 is a horizontal direction in FIG. 3. In FIG. 3, the central axis of the circle of the coil of the high frequency measurement sensor 12 is substantially the same as the central axis of the circle of the low frequency measurement sensor 11.

The composite sensor 10 is a sensor in which the low frequency measurement sensor 11 and the high frequency measurement sensor 12 are combined. As shown in FIG. 3, the coil of the high frequency measurement sensor 12 is disposed in order to cover the low frequency measurement sensor 11. Specifically, the high frequency measurement sensor 12 is formed by winding a conductive wire in a coil shape around a hollow cylindrical insulator having an inner diameter close to the outer shape of the low frequency measurement sensor 11. The conductive wire wound in a coil shape may be fixed by an adhesive, and it may be used in a state that the cylindrical insulator is pulled out. Since the coil of the high frequency measurement sensor 12 covers the low frequency measurement sensor 11, the magnetic field generated in the coil of the high frequency measurement sensor 12 when a current flows via the limiting resistor 322 to the high frequency measurement sensor 12 can be made parallel to the magnetic field applied to the low frequency measurement sensor 11. Since the negative feedback circuit 32 controls the intensity of the current flowing via the limiting resistor 322 to the high frequency measurement sensor 12 in accordance with the magnetic field applied to the low frequency measurement sensor 11 (in other words, the output from the low frequency measurement sensor 11), it is possible to cancel the magnetic field applied to the low frequency measurement sensor 11 by the magnetic field in an opposite direction generated in the coil of the high frequency measurement sensor 12. That is, as shown in FIG. 3, since the coil of the high frequency measurement sensor 12 includes the low frequency measurement sensor 11, the high frequency measurement sensor 12 can be operated as a feedback coil. Therefore, the high frequency measurement sensor 12 measures the current flowing through the conductor c and operates as a feedback coil. The diameter of the coil of the high frequency measurement sensor 12, the number of turns, and the diameter of the wound wiring can be determined in accordance with the intensity of the current detected by the high frequency measurement sensor 12, the intensity of the magnetic field applied to the low frequency measurement sensor 11 (in other words, the intensity of the magnetic field to be canceled when the high frequency measurement sensor 12 is used as a feedback coil), the frequency characteristic in a low frequency band, and so on.

In FIG. 3, the coil of the high frequency measurement sensor 12 is disposed so as to include the low frequency measurement sensor 11, but if the high frequency measurement sensor 12 can operate as a feedback coil of the low frequency measurement sensor 11, the arrangement of the low frequency measurement sensor 11 and the arrangement of the high frequency measurement sensor 12 are not limited thereto. That is, the magnetic field generated by the current flowing through the high frequency measurement sensor 12 can cancel the magnetic field applied to the low frequency measurement sensor 11. For example, the low frequency measurement sensor 11 may include the high frequency measurement sensor 12 in a state where the central axis of the low frequency measurement sensor 11 is substantially the same as the central axis of the high frequency measurement sensor 12. A plurality of high frequency measurement sensors 12 may be disposed for one low frequency measurement sensor 11, and one high frequency measurement sensor 12 may be disposed for a plurality of low frequency measurement sensors 11.

Figure 4A:
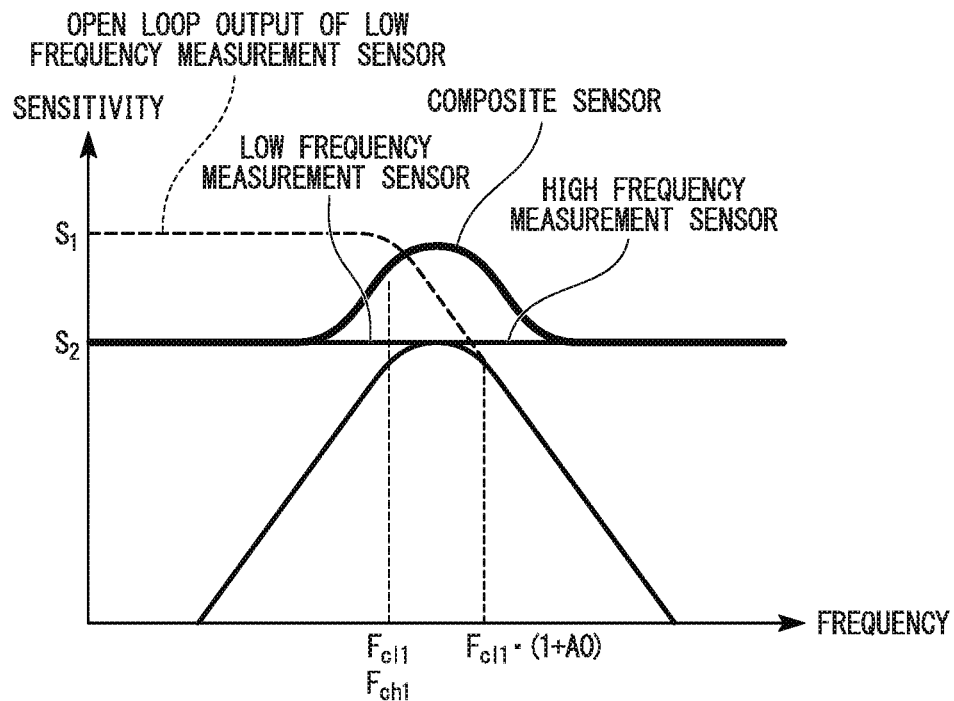
FIG. 4A is a drawing illustrating an example of the frequency characteristic of the sensitivity of the current measurement device in the embodiment.
Figure 4B:
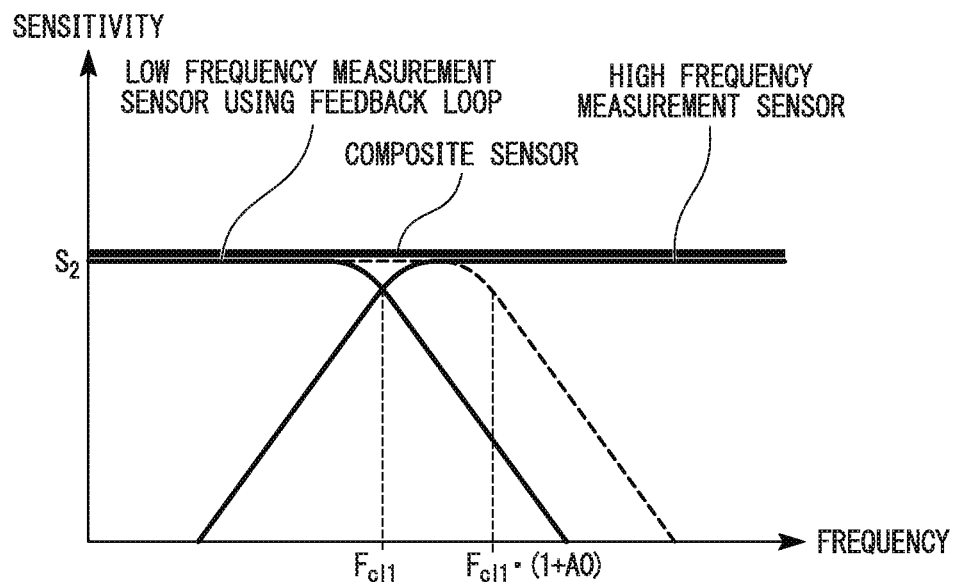
FIG. 4B is a drawing illustrating an example of the frequency characteristic of the sensitivity of the current measurement device in the embodiment.

Next, with reference to FIG. 4A and FIG. 4B, the frequency characteristics of the sensitivity of the low frequency measurement sensor 11 and the sensitivity of the high frequency measurement sensor 12 using the feedback loop will be described. FIG. 4A and FIG. 4B are drawings illustrating an example of the frequency characteristic of the sensitivity of the current measurement device in the embodiment.

In FIG. 4A, the vertical axis represents a sensitivity indicating a ratio of a sensor output voltage to the current to be measured flowing through the conductor c. The horizontal axis represents a frequency of the current to be measured.

In a case of assuming that there is no feedback of the magnetic field by the coil of the high frequency measurement sensor 12, an open loop output of the low frequency measurement sensor 11 has a frequency characteristic of a cutoff frequency Fcl1 because there is a low pass filter component caused by the coil. The open loop output of the low frequency measurement sensor 11 becomes the sensitivity S1 in a band lower than the cutoff frequency Fcl1, and falls below the sensitivity S1 in a band higher than the cutoff frequency Fcl1. In the low frequency measurement sensor 11 using the feedback loop, in a case that the low pass filter 326, the integration circuit 321, and the differentiation circuit 323 do not exist in the configuration shown in FIG. 2 and the coil is used as the high frequency measurement sensor 12, there is a low pass filter component caused by the coil in the feedback loop. Therefore, when a gain of the amplification circuit 324 is A0, the cutoff frequency of the low frequency measurement sensor 11 using the feedback loop is $(1+A0) \times Fcl1$. In this way, the cutoff frequency moves to be higher. In a band higher than the cutoff frequency $(1+A0) \times Fcl1$, the output of the low frequency measurement sensor 11 is lower than the sensitivity S2.

The high frequency measurement sensor 12 has a frequency characteristic of a cutoff frequency Fch1 because of a high pass filter component caused by the coil. The output of the high frequency measurement sensor 12 becomes the sensitivity S2 in a band higher than the cutoff frequency Fch1, and falls below the sensitivity S2 in a band lower than the cutoff frequency Fch1. Both the sensitivity of the low frequency measurement sensor 11 and the sensitivity of the high frequency measurement sensor 12 using the feedback loop become S2 because the applied magnetic field in the coil of the high frequency measurement sensor 12 is controlled to be zero, and the control current from the measurement sensor 12 is detected as an output signal. The cutoff frequency Fcl1 and the cutoff frequency Fch1 are equal because they are the same coil.

The sensitivity of the composite sensor 10 is a sensitivity obtained by combining the sensitivity of the low frequency measurement sensor 11 and the sensitivity of the high frequency measurement sensor 12 using the feedback loop. In FIG. 4A and FIG. 4B, the sensitivity of the composite sensor 10 is shown by a bold line. In a frequency band in which both the sensitivity of the low frequency measurement sensor 11 and the sensitivity of the high frequency measurement sensor 12 using the feedback loop are obtained, the sensitivity of the composite sensor 10 is a value obtained by adding the sensitivity of the low frequency measurement sensor 11 and the high frequency measurement sensor 12. The sensitivity of the composite sensor 10 has the same frequency characteristic as the sensitivity of the low frequency measurement sensor 11 in a frequency band from a frequency of direct current to a frequency where the sensitivity of the high frequency measurement sensor 12 is approximately zero. The sensitivity of the composite sensor 10 has the same frequency characteristic as the sensitivity of the high frequency measurement sensor 12 in a band higher than the frequency where the sensitivity of the high frequency measurement sensor 12 is approximately zero.

In the present embodiment, since the low frequency measurement sensor and the high frequency measurement sensor having the above-described frequency characteristic are used, it is possible to realize the composite sensor 10 having sensitivity in a wide frequency band from direct current to high frequency.

Adjustment of the frequency characteristic will be described with reference to FIG. 4B. In order to make the sensitivity obtained by combining the low frequency measurement sensor 11 and the high frequency measurement sensor 12 using the feedback loop as a flat frequency characteristic, it is necessary to adjust the frequency characteristic using a low pass filter. By using the low pass filter (LPF) described later in FIG. 5, the cutoff frequency at which the sensitivity of the low frequency measurement sensor 11 using the feedback loop falls can be moved to a low frequency side. This makes it possible to adjust the intensity of the sensitivity of the composite sensor 10 in a frequency band where the sensitivity of the low frequency measurement sensor 11 and the sensitivity of the high frequency measurement sensor 12 using the feedback loop are added. As shown in FIG. 4B, by changing the frequency characteristic of the low frequency measurement sensor 11 using the feedback loop by the low pass filter, the sensitivity of the composite sensor 10 is set to be flat frequency characteristic from direct current to high frequency. Since the low pass filter is used for adjusting the frequency characteristic of the low frequency measurement sensor 11 using the feedback loop, it is possible to obtain a frequency characteristic of flat sensitivity without additionally disposing an adjustment circuit for adjusting the sensitivity of the low frequency measurement sensor 11 and the sensitivity of the high frequency measurement sensor 12 using a feedback loop and an addition circuit for adding outputs from them. In FIG. 4B, the sensitivity of the composite sensor 10 is flat from direct current to high frequency, but depending on the frequency characteristic of the low frequency measurement sensor 11 and the frequency characteristic of the high frequency measurement sensor 12 using the feedback loop, the frequency characteristic of the composite sensor 10 may not be flat. In the present embodiment, it is possible to finely adjust the sensitivity of the composite sensor 10 by adjusting the frequency characteristic of the low pass filter.

Figure 5:
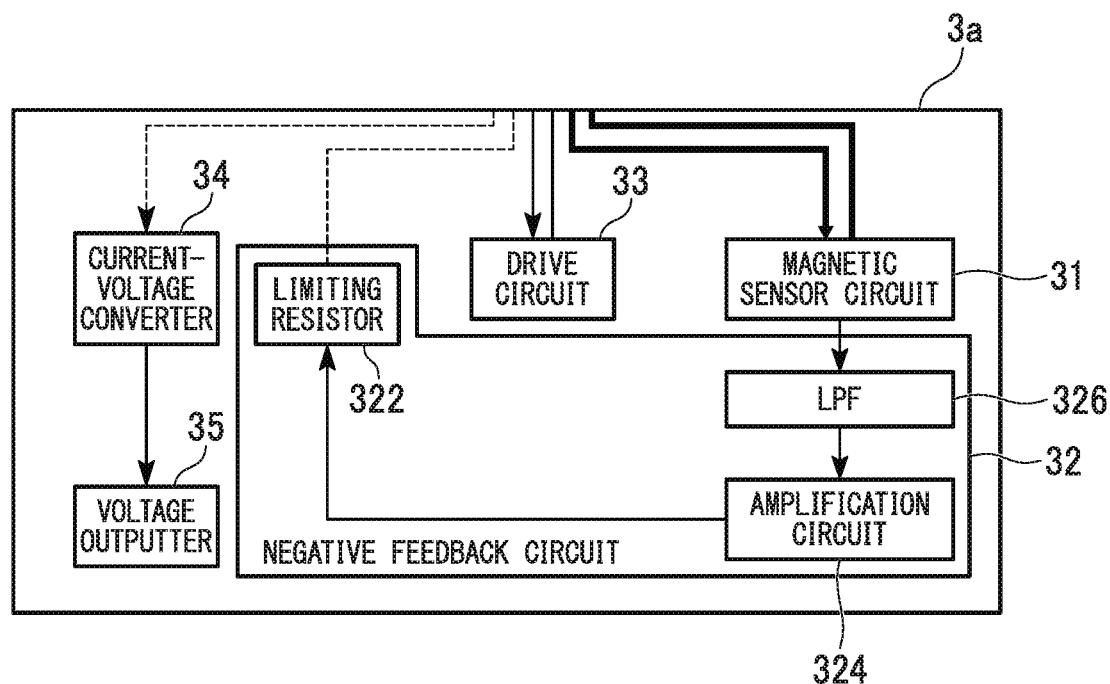
FIG. 5 is a block diagram illustrating another example of the circuit configuration of the current measurement device in the embodiment.

In FIG. 4B, since the frequency at which the sensitivity of the low frequency measurement sensor 11 using the feedback loop falls is moved to the low frequency side by using the low pass filter, the sensitivity obtained by combining the low frequency measurement sensor 11 and the high frequency measurement sensor 12 using the feedback loop is adjusted. However, the method of adjusting the sensitivity is not limited thereto. For example, the sensitivity may be adjusted by moving the frequency at which the sensitivity of the high frequency measurement sensor 12 falls to the high frequency side by using a high pass filter. Furthermore, the sensitivity may be adjusted by moving the frequency characteristic of the low frequency measurement sensor 11 and the frequency characteristic of the high frequency measurement sensor 12 using the feedback loop, respectively. However, the high frequency measurement sensor 12 is a current sensor using a Rogowski coil, and has a high pass characteristic caused by resistance component and inductance component of the coil itself, and is connected to a post stage of the negative feedback circuit 32. For this reason, it is possible to simplify the circuit configuration by adjusting the frequency characteristic of the low frequency measurement sensor 11 by using a low pass filter, rather than by adjusting the frequency characteristic of the high frequency measurement sensor 12 by using a high pass filter. With reference to FIG. 5, a method of adjusting the frequency characteristic of the low frequency measurement sensor 11 using the feedback loop by using the low pass filter will be described.

Next, another configuration of the negative feedback circuit 32 will be described with reference to FIG. 5. FIG. 5 is a block diagram illustrating another example of the circuit configuration of the current measurement device in the embodiment.

In FIG. 5, the circuit unit 3a is another embodiment of the circuit unit 3 described in FIG. 2. Since the configurations of the current sensor 1 other than the circuit unit 3 in FIG. 2 are all the same as those in FIG. 5, only the circuit unit 3a is shown and other parts are omitted in FIG. 5. In FIG. 5, parts that correspond to those in FIG. 2 are assigned the same reference numerals, and the descriptions thereof will be omitted.

The negative feedback circuit 32 has a low pass filter 326, an amplification circuit 324, and a limiting resistor 322. The amplification circuit 324 of the negative feedback circuit 32 performs an integration control based on the intensity of the magnetic field of the conductor c measured by the low frequency measurement sensor 11, and the amplification circuit 324 outputs a voltage value. The limiting resistor 322 is included in the negative feedback circuit 32 together with the amplification circuit 324, converts the voltage value output from the amplification circuit 324 into a current value, and feeds the current value back to the high frequency measurement sensor 12. The low pass filter 326 can be connected to a post stage of the magnetic sensor circuit 31 or a post stage of the amplification circuit 324, and the low pass filter 326 adjusts the frequency characteristic of the low frequency measurement sensor 11 using the feedback loop.

Figure 6:
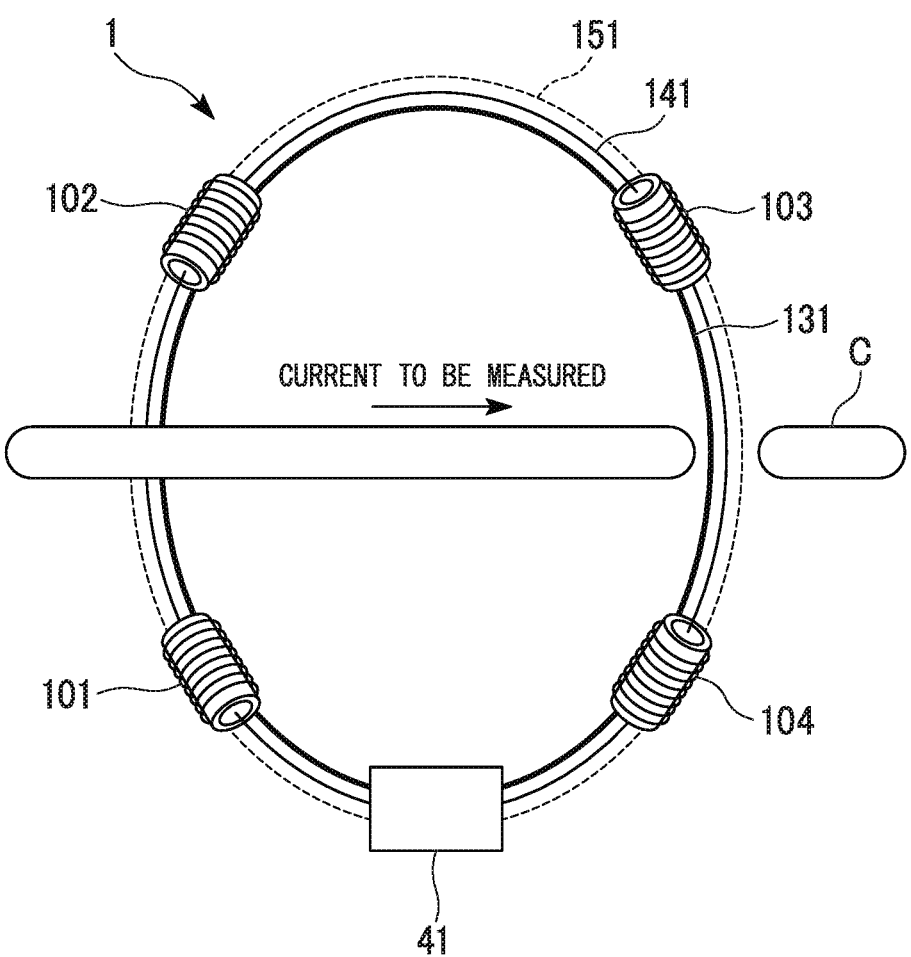
FIG. 6 is a drawing illustrating another example of the configuration of the current sensor in the embodiment.

Next, with reference to FIG. 6, a configuration of the current sensor using a plurality of composite sensors will be described. FIG. 6 is a drawing illustrating another example of the configuration of the current sensor in the embodiment.

The current sensor 1 in FIG. 6 is another embodiment of the current sensor 1 described in FIG. 2. In FIG. 6, since the configuration other than the current sensor 1 in FIG. 2 is similar, only the current sensor 1 and the connector 41 are illustrated and the others are omitted. In FIG. 6, parts that correspond to those in FIG. 2 are assigned the same reference numerals, and the descriptions thereof will be omitted.

In FIG. 6, the current sensor 1 includes a composite sensor 101, a composite sensor 102, a composite sensor 103, a composite sensor 104, a low frequency measurement sensor wire 131, a low frequency measurement sensor drive wire 141, and a high frequency measurement sensor wire 151. The composite sensor 101, the composite sensor 102, the composite sensor 103, the composite sensor 104, the low frequency measurement sensor wire 131, the low frequency measurement sensor drive wire 141, and the high frequency measurement sensor wire 151 are loop-shaped wire portions.

In the current sensor 1, a plurality of composite sensors of the composite sensor 101, the composite sensor 102, the composite sensor 103, and the composite sensor 104 disposed around the wire portion will be hereinafter called as "composite sensor group". The intensity of the magnetic field generated by the current flowing through the conductor c measured by the composite sensor differs depending on a distance between the composite sensor and the conductor c.

The composite sensor group is disposed around the conductor c so that an influence of the distance between the composite sensor and the conductor c can be reduced, as compared with a case where there is only one composite sensor. Therefore, it is preferable that each composite sensor in the composite sensor group is arranged at an equal angle (equal interval) around the wire portion. In the example shown in FIG. 6, since the composite sensor group includes the four composite sensors (the composite sensor 101, the composite sensor 102, the composite sensor 103, and the composite sensor 104), each composite sensor is disposed approximately at 90° when considering the wire portion as a circle. Even if a plurality of composite sensors is disposed, the wire portion is flexible. Therefore, even if the installation space around the conductor c is limited, the current sensor 1 can easily be wound around the conductor c and installed.

Each of the composite sensor 101, the composite sensor 102, the composite sensor 103, and the composite sensor 104 has the low frequency measurement sensor 11 and the high frequency measurement sensor 12 described in FIG. 2. The composite sensor group is provided around the loop of the wire portion, and it is possible to measure the magnetic field generated around the conductor c when the wire portion is wound around the conductor c. In FIG. 6, in order to explain easily, the diameter of the conductor c and the diameter of the loop of the wire portion are shown to be significantly different from each other. However, since the influence of the distance between the conductor c and the wire portion can be reduced by the composite sensor group, the difference between the diameter of the conductor c and the diameter of the loop of the wire portion can be made larger than in the case of FIG. 2.

The low frequency measurement sensor wire 131, the low frequency measurement sensor drive wire 141, and the high frequency measurement sensor wire 151 are disposed as many as the number of the composite sensors. That is, each of the low frequency measurement sensor wire 131, the low frequency measurement sensor drive wire 141, and the high frequency measurement sensor wire 151 has four wires of the composite sensor 101, the composite sensor 102, the composite sensor 103, and the composite sensor 104. As to the circuit unit 3 shown in FIG. 2, which is not shown in FIG. 6, the four composite sensors may share one circuit unit, or may have a circuit unit individually. The connector 41 has contact points corresponding to the number of the low frequency measurement sensor wire 131, the low frequency measurement sensor drive wire 141, and the high frequency measurement sensor wire 151. Each of the low frequency measurement sensor wire 131, the low frequency measurement sensor drive wire 141, and the high frequency measurement sensor wire 151 may be connected by a single wire to the low frequency measurement sensors 11 and the high frequency measurement sensors 12 in the composite sensor 101, the composite sensor 102, the composite sensor 103, and the composite sensor 104.

As shown in FIG. 6, the current sensor 1 has four composite sensors, but the number of the composite sensors is not limited thereto. For example, the number of the composite sensors may be five or more. If the wire portion is flexible enough to be wound around the conductor c, the composite sensor may be arranged around substantially whole of the wire portion.

First Embodiment

Figure 7:
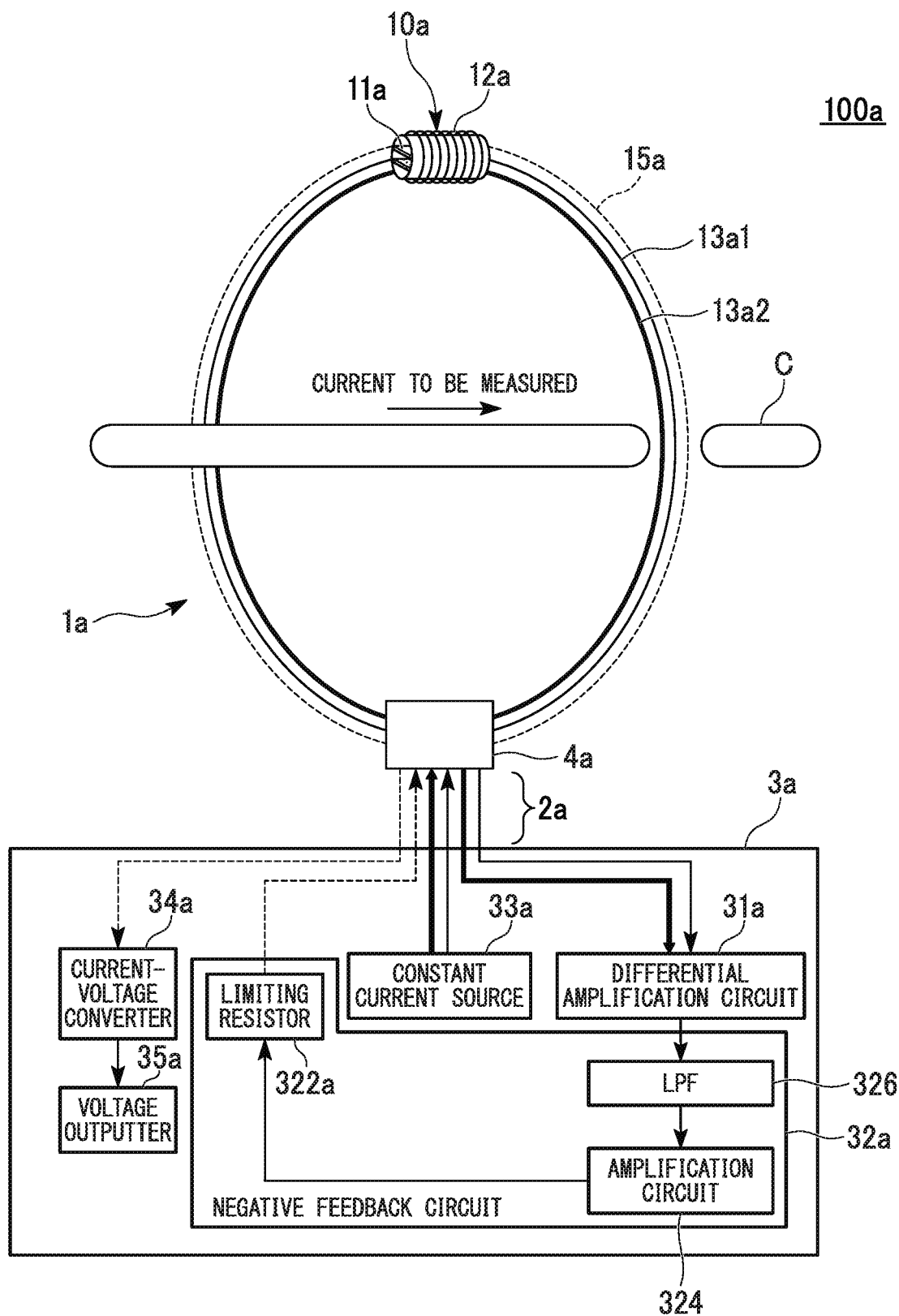
FIG. 7 is a drawing illustrating an example of the configuration of the current measurement device in the first embodiment.

Next, with reference to FIG. 7, the configuration of the current measurement device in a first embodiment will be described. FIG. 7 is a drawing illustrating an example of the configuration of the current measurement device in the first embodiment. The first embodiment to the sixth embodiment described below are classified in accordance with a type of the element of the magnetic sensor in the low frequency measurement sensor and a difference in the number (one or plural) of the composite sensors.

The first embodiment is an embodiment in which one magnetic resistance element is used as the low frequency measurement sensor. A bias magnetic field is applied to the magnetic resistance element in order to determine a polarity of the signal magnetic field. For example, when a bias magnetic field is applied by a current flowing to the feedback coil, the magnetic resistance element is driven at an operating point where linearity and sensitivity are high, and it is possible to determine the polarity. The output of the magnetic resistance element to which the bias magnetic field has been applied is negatively fed back as a current to the feedback coil, the magnetic field applied to the magnetic resistance element is controlled to be zero (zero flux), and the current flowing through the feedback coil is output as an output signal. As a result, since hysteresis and magnetic saturation can be avoided, linearity and span are greatly improved. If a high frequency measurement coil is used as the feedback coil, it is possible to combine them easily, and the frequency characteristic is improved. The feedback coil includes a high sensitivity magnetic resistance element and a low sensitivity magnetic resistance element, and the feedback coil applies a bias magnetic field to the magnetic resistance element in the coil. Both differential outputs are obtained by using the high sensitivity magnetic resistance element and the low sensitivity magnetic resistance element so that the temperature characteristic of the magnetic resistance element can be corrected. For example, the bias magnetic field for determining the polarity of the signal magnetic field may be applied using a magnetic field of a magnet. As the magnetic resistance element, a magnetic resistance element for detecting a magnetic field component in a direction perpendicular to a laminated surface is used. However, as the magnetic resistance element, a nano-granular TMR (Tunnel Magnetic Resistance) type magnetic sensor may be used. The nano-granular TMR magnetic sensor has a structure in which a nano-granular TMR film for detecting a magnetic field component in a longitudinal direction of a soft magnetic yoke (horizontal direction to the surface) is sandwiched between soft magnetic yokes. A configuration example in a case that a magnetic resistance element is used as a magnetic sensor will be described below.

In FIG. 7, the current measurement device 100a has a current sensor 1a, a cable 2a, a circuit unit 3a, and a connector 4a. The current sensor 1a has a composite sensor 10a, a high sensitivity magnetic resistance sensor wire 13a1, a low sensitivity magnetic resistance sensor wire 13a2, and a high frequency measurement coil wire 15a. For example, the composite sensor 10a in the first embodiment includes a magnetic resistance sensor 11a as the low frequency measurement sensor and a high frequency measurement coil 12a as the high frequency measurement sensor. That is, the high frequency measurement coil 12a covers the magnetic resistance sensor 11a so that the magnetism sensing direction of the high frequency measurement coil 12a is the same as the magnetism sensing direction of the magnetic resistance sensor 11a. This makes it possible to make the direction of the magnetic field generated in the high frequency measurement coil 12a and the direction of the magnetic field applied to the magnetic resistance sensor 11a parallel when the current flows via the limiting resistor 322a to the high frequency measurement coil 12a. The negative feedback circuit 32a controls the intensity of the current flowing via the limiting resistor 322a to the high frequency measurement coil 12a in accordance with the output from the magnetic resistance sensor 11a. This makes it possible to cancel the magnetic field applied to the magnetic resistance sensor 11a by the magnetic field in the opposite direction generated in the high frequency measurement coil 12a. That is, the high frequency measurement coil 12a measures the current flowing through the conductor c, and operates as the feedback coil.

The high sensitivity magnetic resistance sensor wire 13a1 connects, to the connector 4a, the high sensitivity magnetic resistance sensor of the magnetic resistance sensor 11a, which will be described later with reference to FIG. 8, and the circuit unit 3a. The low sensitivity magnetic resistance sensor wire 13a2 connects the low sensitivity magnetic resistance sensor of the magnetic resistance sensor 11a to the connector 4a.

The high frequency measurement coil wire 15a connects the high frequency measurement coil 12a to the connector 4a.

The connector 4a connects, to the cable 2a, the high sensitivity magnetic resistance sensor wire 13a1, the low sensitivity magnetic resistance sensor wire 13a2, and the high frequency measurement coil wire 15a, and the connector 4a outputs, to the differential amplification circuit 31a, the signal output from the magnetic resistance sensor 11a via the cable 2a and the signal output from the high frequency measurement coil 12a.

The differential amplification circuit 31a calculates a differential output between the output signal from the high sensitivity magnetic resistance sensor and the output signal from the low sensitivity magnetic resistance sensor of the magnetic resistance sensor 11a, which will be described later with reference to FIG. 8, and the differential amplification circuit 31a outputs a voltage proportional to the current to be measured to the negative feedback circuit 32a. The constant current source 33a supplies a constant current to the magnetic resistance sensor 11a.

Next, with reference to FIG. 8, the configuration of the composite sensor 10a in the first embodiment described with reference to FIG. 7 will be described. FIG. 8 is a drawing illustrating an example of the configuration of the current sensor in the first embodiment.

Figure 8:
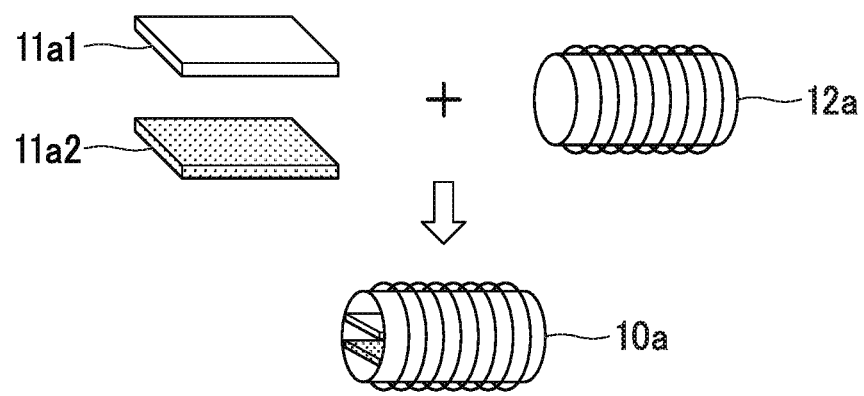
FIG. 8 is a drawing illustrating an example of the configuration of the current sensor in the first embodiment.

As shown in FIG. 8, the composite sensor 10a has a magnetic resistance sensor 11a and a high frequency measurement coil 12a. The magnetic resistance sensor 11a has a high sensitivity magnetic resistance sensor 11a1 and a low sensitivity magnetic resistance sensor 11a2. The high sensitivity magnetic resistance sensor 11a1 is disposed in parallel to the low sensitivity magnetic resistance sensor 11a2. The magnetism sensing direction of the high sensitivity magnetic resistance sensor 11a1 is the same as the magnetism sensing direction of the low sensitivity magnetic resistance sensor 11a2. One end of the high sensitivity magnetic resistance sensor 11a1 and one end of the low sensitivity magnetic resistance sensor 11a2 are grounded, and another end of the high sensitivity magnetic resistance sensor 11a1 and another end of the low sensitivity magnetic resistance sensor 11a2 are connected to the constant current source 33a. The differential amplification circuit 31a shown in FIG. 7 detects a differential output of voltages applied to the magnetic resistance sensors in accordance with an intensity of the magnetic field. A change of the high sensitivity magnetic resistance sensor 11a1 with respect to a change of a magnetic field is greater than a change of the low sensitivity magnetic resistance sensor 11a2 with respect to a change of a magnetic field. The differential amplification circuit 31a detects a change of each resistance value as a difference (differential output) of the voltage values generated by the constant current source 33a, and measures an intensity of the magnetic field in accordance with the difference of the voltage values.

The magnetism sensing direction of the high frequency measurement coil 12a is the same as the magnetism sensing direction of the magnetic resistance sensor 11a having the high sensitivity magnetic resistance sensor 11a1 and the low sensitivity magnetic resistance sensor 11a2. The high frequency measurement coil 12a is disposed to cover the magnetic resistance sensor 11a in order to form a coil. Specifically, the high frequency measurement coil 12a is formed by winding a conductive wire in a coil shape around a hollow cylindrical insulator having an inner diameter close to the outer shape of the magnetic resistance sensor 11a. The conductive wire wound in a coil shape may be fixed by an adhesive, and it may be used in a state that the cylindrical insulator is pulled out. When a current flows via the limiting resistor 322a shown in FIG. 7 to the high frequency measurement coil 12a, the high frequency measurement coil 12a can make a direction of the magnetic field generated in the high frequency measurement coil 12a be parallel to a direction of the magnetic field applied to the magnetic resistance sensor 11a. The negative feedback circuit 32a controls the intensity of the current flowing through the limiting resistor 322a to the high frequency measurement coil 12a in accordance with the magnetic field applied to the magnetic resistance sensor 11a (in other words, an output from the magnetic resistance sensor 11a) so that the high frequency measurement coil 12a operates as a feedback coil that cancels the magnetic field applied to the magnetic resistance sensor 1a by applying a magnetic field in an opposite direction generated in the high frequency measurement coil 12a.

Second Embodiment

Figure 9:
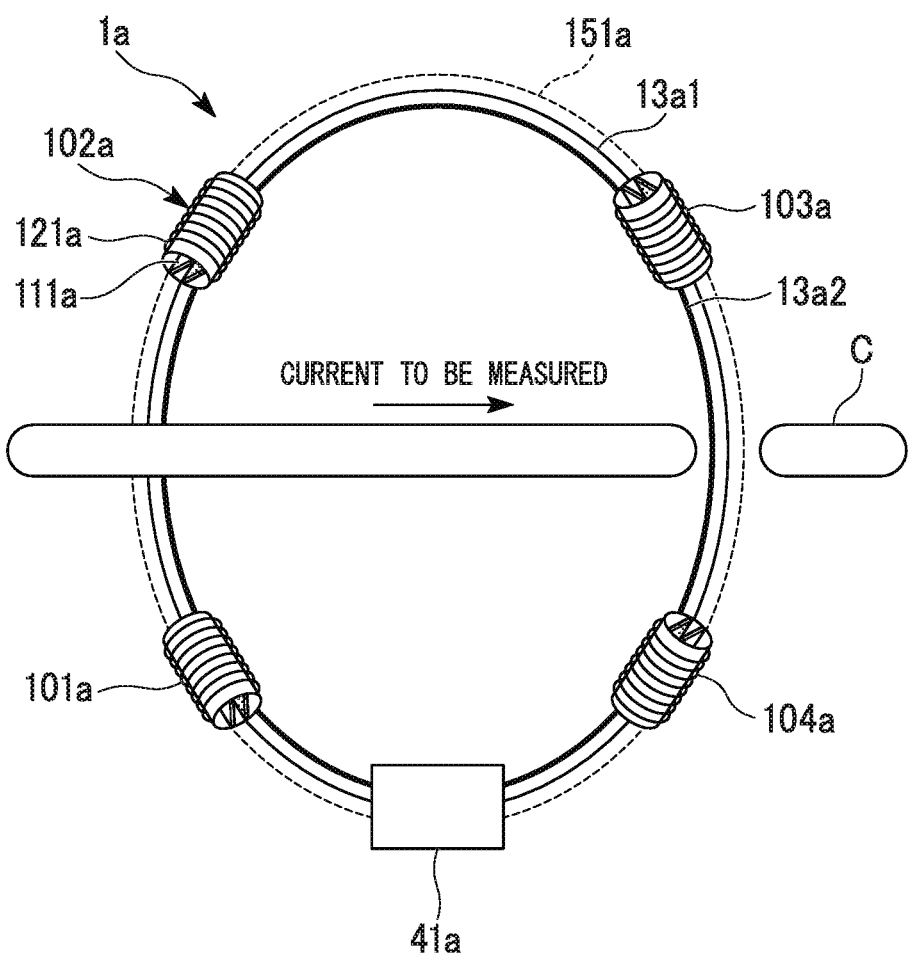
FIG. 9 is a drawing illustrating an example of the configuration of the current measurement device in the second embodiment.

Next, with reference to FIG. 9, the configuration of the current measurement device in the second embodiment will be described. FIG. 9 is a drawing illustrating an example of the configuration of the current measurement device in the second embodiment. The current measurement device in the second embodiment uses a current sensor in which a plurality of composite sensors 10a shown in the first embodiment is disposed.

In FIG. 9, the current sensor 1a is another embodiment of the current sensor 1a described in FIG. 7. In FIG. 9, since the configuration other than the current sensor 1a in FIG. 7 is similar, only the current sensor 1a and the connector 41a are illustrated and the others are omitted. In FIG. 9, parts that correspond to those in FIG. 7 are assigned the same reference numerals, and the descriptions thereof will be omitted.

In FIG. 9, the current sensor 1a has a composite sensor 101a, a composite sensor 102a, a composite sensor 103a, a composite sensor 104a, a high sensitivity magnetic resistance sensor wire 131a1, a low sensitivity magnetic resistance sensor wire 131a2, and a high frequency measurement coil wire 151a. The composite sensor 101a, the composite sensor 102a, the composite sensor 103a, the composite sensor 104a, the high sensitivity magnetic resistance sensor wire 131a1, the low sensitivity magnetic resistance sensor wire 131a2, and the high frequency measurement coil wire 151a are loop-shaped wire portions.

Since the composite sensor group (the composite sensor 101a, the composite sensor 102a, the composite sensor 103a, and the composite sensor 104a) is disposed around the wire portion in the current sensor 1a, it is possible to reduce an influence of a variation of the intensity of the magnetic field corresponding to a variation of the distance between the composite sensor and the conductor c. Even if a plurality of sets of the composite sensors is disposed, the wire portion is flexible. Therefore, even if the installation space around the conductor c is limited, the current sensor 1a can easily be wound around the conductor c and installed.

Third Embodiment

Figure 10:
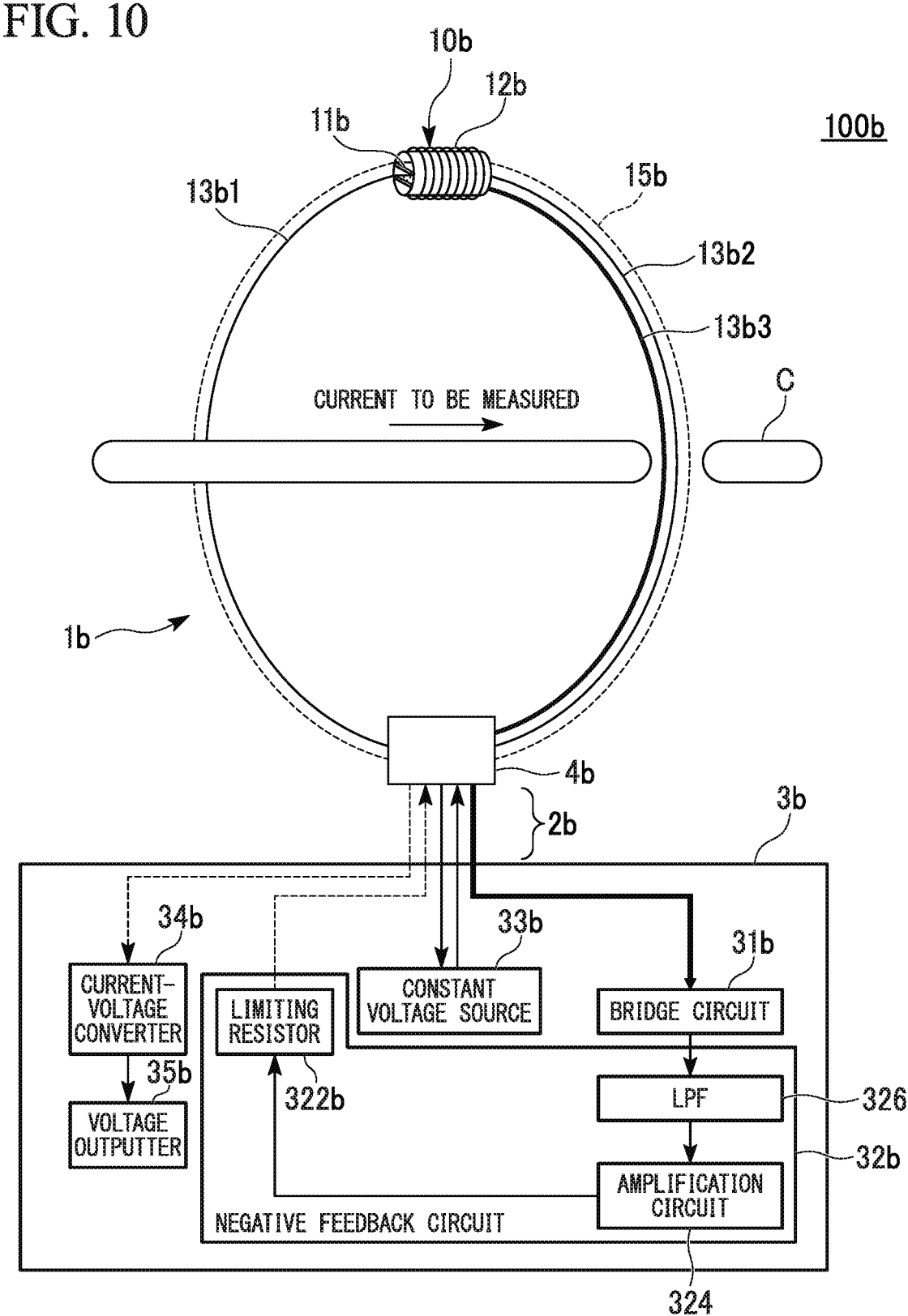
FIG. 10 is a drawing illustrating an example of the configuration of the current measurement device in the third embodiment.

Next, with reference to FIG. 10, the configuration of the current measurement device in the third embodiment will be described. FIG. 10 is a drawing illustrating an example of the configuration of the current measurement device in the third embodiment.

In FIG. 10, the current measurement device 100b has a current sensor 1b, a cable 2b, a circuit unit 3b, and a connector 4b. The current sensor 1b has a composite sensor 10b, a high sensitivity magnetic resistance sensor wire 13b1, a low sensitivity magnetic resistance sensor wire 13b2, and a high frequency measurement coil wire 15b.

Figure 11A:
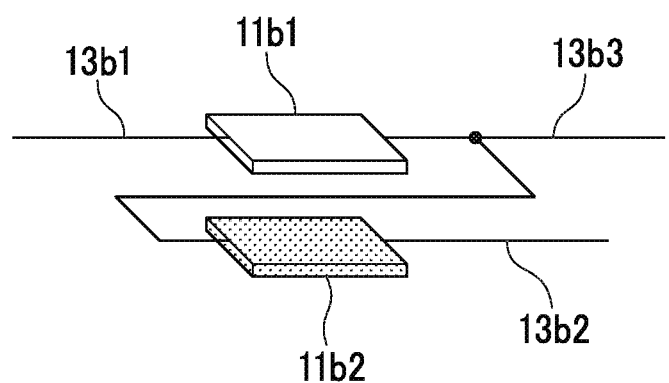
FIG. 11A is a drawing illustrating an example of the configuration of the current sensor in the third embodiment.
Figure 11B:
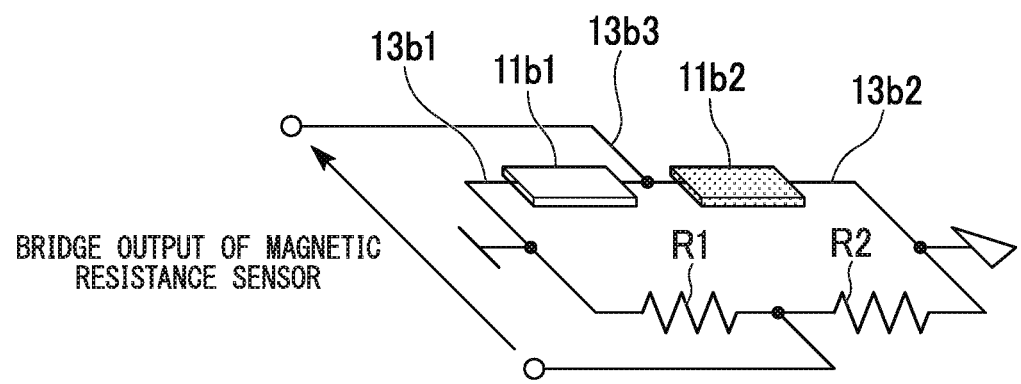
FIG. 11B is a drawing illustrating an example of the configuration of the current sensor in the third embodiment.

For example, the composite sensor 10b in the third embodiment includes a magnetic resistance sensor 11b shown in FIG. 11A and FIG. 11B as the low frequency measurement sensor and a high frequency measurement coil 12b as the high frequency measurement sensor. In other words, the high frequency measurement coil 12b covers the magnetic resistance sensor 11b so that a magnetism sensing direction of the high frequency measurement coil 12b is the same as a magnetism sensing direction of the magnetic resistance sensor 11b. This makes it possible to make the direction of the magnetic field generated in the high frequency measurement coil 12b and the direction of the magnetic field applied to the magnetic resistance sensor 11b parallel when the current flows via the limiting resistor 322b to the high frequency measurement coil 12b. The negative feedback circuit 32b controls the intensity of the current flowing via the limiting resistor 322b to the high frequency measurement coil 12b in accordance with the output from the magnetic resistance sensor 11b. This makes it possible to cancel the magnetic field applied to the magnetic resistance sensor 11b by the magnetic field in the opposite direction generated in the high frequency measurement coil 12b. That is, the high frequency measurement coil 12b measures the current flowing through the conductor c, and operates as the feedback coil.

Functions of the high sensitivity magnetic resistance sensor wire 13b1, the low sensitivity magnetic resistance sensor wire 13b2, the high frequency measurement coil wire 15b, and the connector 4b will be described later with reference to FIG. 11A and FIG. 11B.

A bridge circuit 31b is a bridge circuit configured using a high sensitivity magnetic resistance sensor and a low sensitivity magnetic resistance sensor of the magnetic resistance sensor 11b, which will be described later with reference to FIG. 11A and FIG. 11B. The bridge circuit 31b supplies a voltage proportional to the current to be measured to the negative feedback circuit 32b. The constant voltage source 33b supplies a constant voltage to the magnetic resistance sensor 11b.

Next, the configuration of the composite sensor 10b in the third embodiment described with reference to FIG. 10 will be described with reference to FIG. 11A and FIG. 11B. FIG. 11A and FIG. 11B are drawings illustrating an example of the configuration of the current sensor in the third embodiment.

As shown in FIG. 11A, the composite sensor 10b includes a magnetic resistance sensor 11b and a high frequency measurement coil 12b. The magnetic resistance sensor 11b has a high sensitivity magnetic resistance sensor 11b1 and a low sensitivity magnetic resistance sensor 11b2. The high sensitivity magnetic resistance sensor 11b1 is disposed in parallel to the low sensitivity magnetic resistance sensor 11b2. The magnetism sensing direction of the high sensitivity magnetic resistance sensor 11b1 is the same as the magnetism sensing direction of the low sensitivity magnetic resistance sensor 11b2. One end of the high sensitivity magnetic resistance sensor 11b1 and one end of the low sensitivity magnetic resistance sensor 11b2 are connected in series to each other. Another end of the high sensitivity magnetic resistance sensor 11b1 is connected to the high sensitivity magnetic resistance sensor wire 13b1. Another end of the low sensitivity magnetic resistance sensor 11b2 is connected to the low sensitivity magnetic resistance sensor wire 13b2. A middle point between the high sensitivity magnetic resistance sensor 11b1 and the low sensitivity magnetic resistance sensor 11b1 is connected to the magnetic resistance sensor signal wire 13b3.

The high sensitivity magnetic resistance sensor 11b1 and the low sensitivity magnetic resistance sensor 11b2 in the third embodiment are the same as the high sensitivity magnetic resistance sensor 11a1 and the low sensitivity magnetic resistance sensor 11a2 in the second embodiment in a point that these sensors have the same magnetism sensing direction and are disposed in parallel to each other. However, These are different from each other in a point that the high sensitivity magnetic resistance sensor 11a1 and the low sensitivity magnetic resistance sensor 11a2 in the second embodiment are connected in parallel to each other, but the high sensitivity magnetic resistance sensor 11b1 and the low sensitivity magnetic resistance sensor 11b2 in the third embodiment are connected in series to each other.

FIG. 11B is a circuit diagram including the bridge circuit 31b. The high sensitivity magnetic resistance sensor 11b1, the low sensitivity magnetic resistance sensor 11b2, the resistor R1, and the resistor R2 form a bridge circuit. A middle point between the high sensitivity magnetic resistance sensor 11b1 and the low sensitivity magnetic resistance sensor 11b2 is connected to the magnetic resistance sensor signal wire 13b3 to be one end of the bridge output of the magnetic resistance sensor of the bridge circuit 31b. The high sensitivity magnetic resistance sensor wire 13b1 connected to the high sensitivity magnetic resistance sensor 11b1 is pulled up and connected to the resistor R1 of the bridge circuit 31b. The low sensitivity magnetic resistance sensor wire 13b2 connected to the low sensitivity magnetic resistance sensor 11b2 is grounded and connected to the resistor R2 of the bridge circuit 31b. The resistor R1 and the resistor R2 are connected in series to each other, and a middle point between the resistor R1 and the resistor R2 is another end of the bridge output of the magnetic resistance sensor of the bridge circuit 31b.

One end of the bridge output of the magnetic resistance sensor is a divided voltage of the high sensitivity magnetic resistance sensor 11b1 and the low sensitivity magnetic resistance sensor 11b2 with respect to the pull-up voltage, and the value changes in accordance with change of resistance values of the high sensitivity magnetic resistance sensor 11b1 and the low sensitivity magnetic resistance sensor 11b2. On the other hand, another end of the bridge output of the magnetic resistance sensor is a divided voltage of the resistance R1 and the resistance R2 with respect to the pull-up voltage, and it is a fixed value. In the third embodiment, a bridge circuit formed by the high sensitivity magnetic resistance sensor 11b1, the low sensitivity magnetic resistance sensor 11b2, the resistor R1, and the resistor R2 is used. As a result, the bridge output of the magnetic resistance sensor corresponding to the current to be measured can be output as a voltage.

Fourth Embodiment

Figure 12:
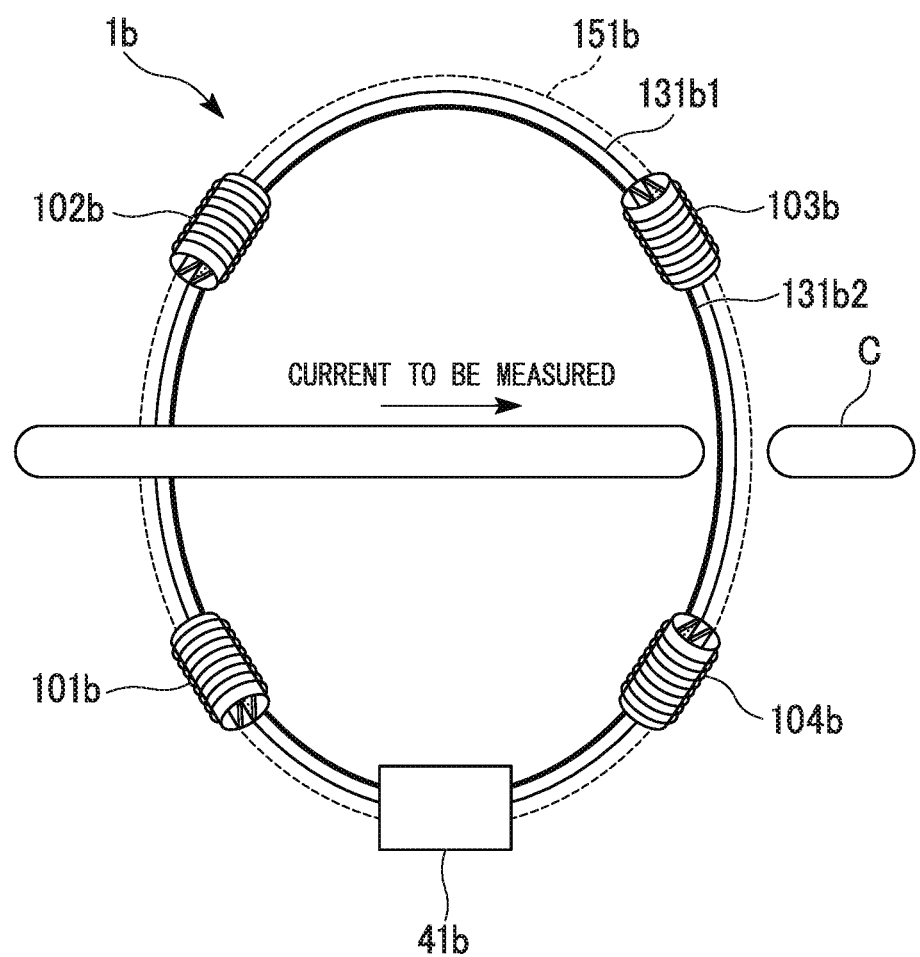
FIG. 12 is a drawing illustrating an example of the configuration of the current measurement device in the fourth embodiment.

Next, the configuration of the current measurement device in the fourth embodiment will be described with reference to FIG. 12. FIG. 12 is a drawing illustrating an example of the configuration of the current measurement device in the fourth embodiment. The current measurement device in the fourth embodiment uses a current sensor in which a plurality of composite sensors 10b shown in the third embodiment is disposed.

In FIG. 12, the current sensor 1b is another embodiment of the current sensor 1b described in FIG. 9. In FIG. 12, since the configuration other than the current sensor 1b in FIG. 9 is similar, only the current sensor 1b and the connector 41b are illustrated and the others are omitted. In FIG. 12, parts that correspond to those in FIG. 9 are assigned the same reference numerals, and the descriptions thereof will be omitted.

In FIG. 12, the current sensor 1b has a composite sensor 101b, a composite sensor 102b, a composite sensor 103b, a composite sensor 104b, a high sensitivity magnetic resistance sensor wire 131b1, a low sensitivity magnetic resistance sensor wire 131b2, and a high frequency measurement coil wire 151b. The composite sensor 101b, the composite sensor 102b, the composite sensor 103b, the composite sensor 104b, the high sensitivity magnetic resistance sensor wire 131b1, the low sensitivity magnetic resistance sensor wire 131b2, and the high frequency measurement coil wire 151b are loop-shaped wire portions.

Since the composite sensor group (the composite sensor 101b, the composite sensor 102b, the composite sensor 103b, and the composite sensor 104b) is disposed around the wire portion in the current sensor 1b, it is possible to reduce an influence of a variation of the intensity of the magnetic field corresponding to a variation of the distance between the composite sensor and the conductor c. Even if a plurality of sets of the composite sensors is disposed, the wire portion is flexible. Therefore, even if the installation space around the conductor c is limited, the current sensor 1b can easily be wound around the conductor c and installed.

Figure 13:
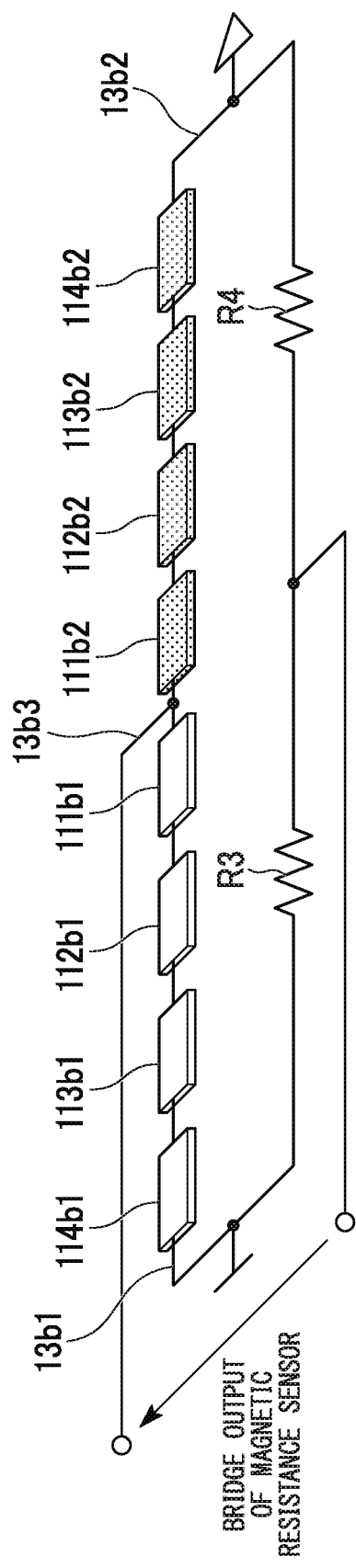
FIG. 13 is a drawing illustrating an example of the configuration of the current sensor in the fourth embodiment.

Next, with reference to FIG. 13, the configuration of the current sensor in the fourth embodiment will be described. FIG. 13 is a drawing illustrating an example of the configuration of the current sensor in the fourth embodiment.

In FIG. 13, a bridge circuit is formed by the high sensitivity magnetic resistance sensor 111b1, the high sensitivity magnetic resistance sensor 112b1, the high sensitivity magnetic resistance sensor 113b1, the high sensitivity magnetic resistance sensor 114b1, the low sensitivity magnetic resistance sensor 111b2, the low sensitivity magnetic resistance sensor 112b2, the low sensitivity magnetic resistance sensor 113b2, the low sensitivity magnetic resistance sensor 114b2, the resistor R3, and the resistor R4. The high sensitivity magnetic resistance sensor 111b1, the high sensitivity magnetic resistance sensor 112b1, the high sensitivity magnetic resistance sensor 113b1, and the high sensitivity magnetic resistance sensor 114b1 which are connected in series are hereinafter called as "high sensitivity magnetic resistance sensor 11nb1". The low sensitivity magnetic resistance sensor 11b2, the low sensitivity magnetic resistance sensor 112b2, the low sensitivity magnetic resistance sensor 113b2, and the low sensitivity magnetic resistance sensor 114b2 which are connected in series are hereinafter called as "low sensitivity magnetic resistance sensor 11nb2". A middle point between the high sensitivity magnetic resistance sensor 11nb1 and the low sensitivity magnetic resistance sensor 11nb2 is connected to the magnetic resistance sensor signal wire 13b3 to be one end of the bridge output of the magnetic resistance sensor of the bridge circuit 31b. The high sensitivity magnetic resistance sensor wire 13b1 connected to the high sensitivity magnetic resistance sensor 11nb1 is pulled up and connected to the resistor R1 of the bridge circuit 31b. The low sensitivity magnetic resistance sensor wire 13b2 connected to the low sensitivity magnetic resistance sensor 11nb2 is grounded and connected to the resistor R4 of the bridge circuit 31b. The resistor R3 and the resistor R4 are connected in series to each other, and a middle point between the resistor R3 and the resistor R4 is another end of the bridge output of the magnetic resistance sensor of the bridge circuit 31b.

One end of the bridge output of the magnetic resistance sensor is a divided voltage of the high sensitivity magnetic resistance sensor 11nb1 and the low sensitivity magnetic resistance sensor 11nb2 with respect to the pull-up voltage, and the value changes in accordance with change of resistance values of the high sensitivity magnetic resistance sensor 11nb1 and the low sensitivity magnetic resistance sensor 11nb2. On the other hand, another end of the bridge output of the magnetic resistance sensor is a divided voltage of the resistance R3 and the resistance R4 with respect to the pull-up voltage, and it is a fixed value. In the fourth embodiment, a bridge circuit formed by the high sensitivity magnetic resistance sensor 11nb1, the low sensitivity magnetic resistance sensor 11nb2, the resistor R3, and the resistor R4 is used. As a result, the bridge output of the magnetic resistance sensor corresponding to the current to be measured can be output as a voltage.

Fifth Embodiment

Figure 14:
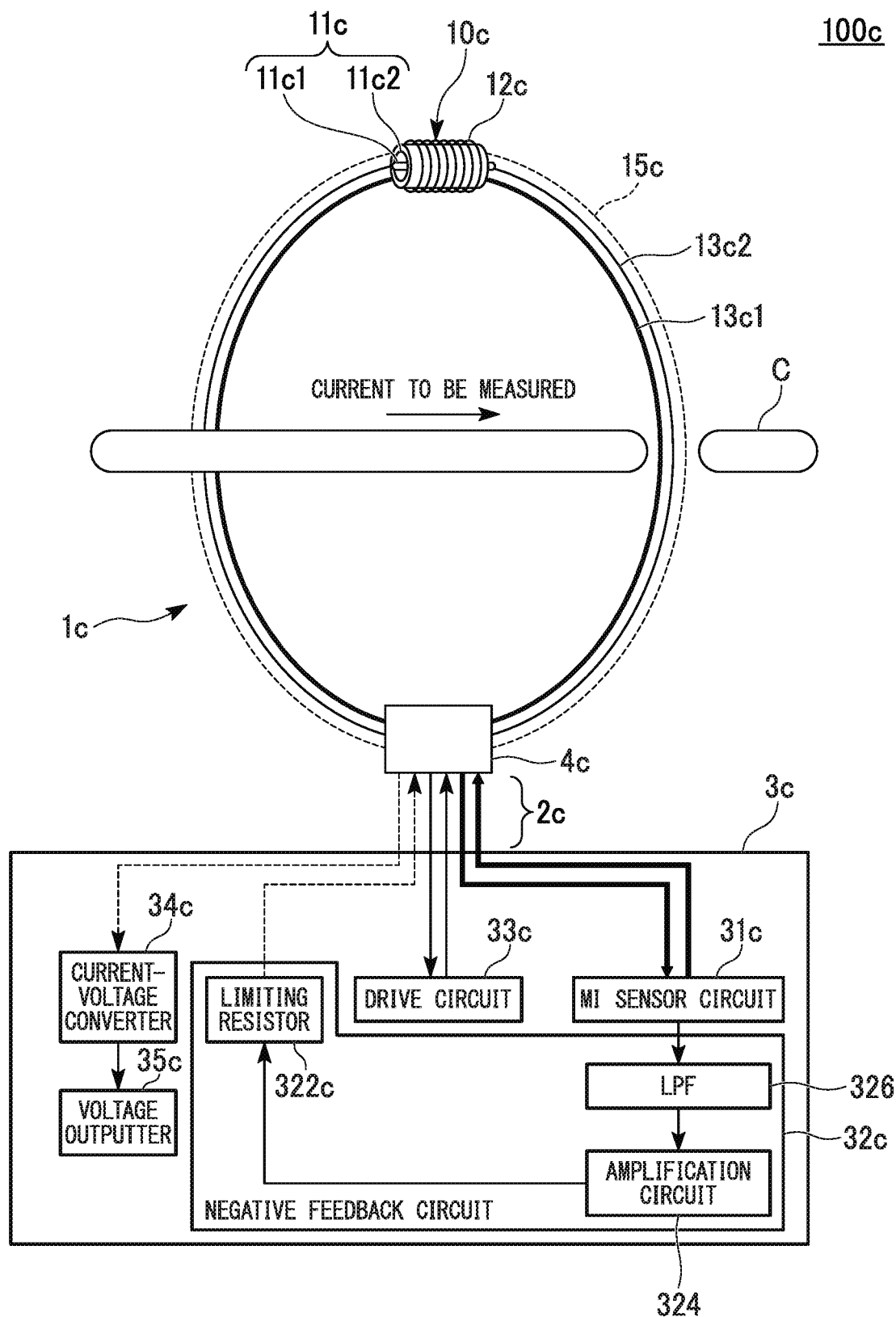
FIG. 14 is a drawing illustrating an example of the configuration of the current measurement device in the fifth embodiment.

Next, with reference to FIG. 14, the configuration of the current measurement device in the fifth embodiment will be described. FIG. 14 is a drawing illustrating an example of the configuration of the current measurement device in the fifth embodiment.

In FIG. 14, the current measurement device 100c has a current sensor 1c, a cable 2c, a circuit unit 3c, and a connector 4c. The current sensor 1c has a composite sensor 10c, a detection coil wire 13c1, a magnetic sensor drive wire 13c2, and a high frequency measurement coil wire 15c.

The composite sensor 10c in the fifth embodiment uses a magnetic impedance (MI) sensor 11c as a low frequency measurement sensor. For example, the MI sensor 11c has an amorphous magnetic wire 11c2 which is a magnetic impedance element and a detection coil 11c1 for detecting a magnetic impedance effect of the amorphous magnetic wire 11c2. The composite sensor 10c includes a high frequency measurement coil 12c as the high frequency measurement sensor. The high frequency measurement coil 12c covers the MI sensor 11c so that a magnetism sensing direction of the high frequency measurement coil 12c is the same as a magnetism sensing direction of the MI sensor 11c are the same. This makes it possible to make the direction of the magnetic field generated in the high frequency measurement coil 12c and the direction of the magnetic field applied to the MI sensor 11c parallel when the current flows via the limiting resistor 322c to the high frequency measurement coil 12c. The negative feedback circuit 32c controls the intensity of the current flowing via the limiting resistor 322c to the high frequency measurement coil 12c in accordance with the output from the MI sensor 11c. This makes it possible to cancel the magnetic field applied to the MI sensor 11c by the magnetic field in the opposite direction generated in the high frequency measurement coil 12c. That is, the high frequency measurement coil 12c measures the current to be measured flowing through the conductor c, and operates as the feedback coil.

The amorphous magnetic wire 11c2 has a magnetic anisotropy in a circumferential direction of the wire. The amorphous magnetic wire 11c2 is magnetized in one direction in the circumferential direction by applying a direct current component to the amorphous magnetic wire 11c2. When an external magnetic field is applied in an axial direction of the amorphous magnetic wire 11c2, a magnetic moment induced in the circumferential direction rotates in a direction of applying the external magnetic field. When a high frequency current flows through the amorphous magnetic wire 11c2, a magnetic field is generated in the circumferential direction. Thereby, the magnetic moment in the circumferential direction rotated by applying the external magnetic field rotates so as to return to the circumferential direction before applying the external magnetic field. Due to the rotation of the magnetic moment, a magnetic moment component which changes in the axial direction of the amorphous magnetic wire 11c2 at an energizing frequency is generated. The magnetic moment component is detected by the detection coil 11c1 so that a signal having an amplitude proportional to the external magnetic field and having the same frequency as a high frequency current is output to the MI sensor circuit 31c. The MI sensor circuit 31c has a detection circuit using an analog switch. The MI sensor circuit 31c removes a drive frequency component from the output of the detection coil 11c1, and detects the external magnetic field as a voltage signal. The detected output is negatively fed back, as a current, via the negative feedback circuit 32c to the high frequency measurement coil 12c operated as a feedback coil, the magnetic field applied to the magnetic impedance element is controlled to be zero (zero flux), and the current flowing through the feedback coil is output as an output signal. As a result, hysteresis and magnetic saturation can be avoided, and linearity and span are greatly improved. If a high frequency measurement coil is used as the feedback coil, it is possible to combine them easily and the frequency characteristic is improved. Especially, since the M sensor having a high sensitivity is used, it is possible to obtain a large open loop gain in the feedback loop, and an output error becomes small. In the MI sensor, an amorphous magnetic wire is used as a magnetism sensing part, and the MI sensor is advantageous in terms of heat resistance and temperature characteristics as compared with a Hall element or an MR sensor using a semiconductor element. Therefore, by using the MI sensor, it is possible to measure the current in high accuracy under high temperature environment.

Since operations of the negative feedback circuit 32c and the high frequency measurement coil 12c are the same as those of the other embodiments, the description thereof will be omitted. In the present embodiment, the amorphous magnetic wire 11c2 is exemplified as a magnetic impedance element, but the magnetic impedance element is not limited thereto. For example, an element having a structure in which a conductor film of copper or the like and an amorphous soft magnetic film are laminated may be used as the magnetic impedance element.

In the present embodiment, a magnetic impedance element in which the detection coil covers the amorphous magnetic wire and the feedback coil covers the detection coil is used, but the magnetic impedance element is not limited thereto. For example, as the magnetic impedance element, an element in which the feedback coil covers the amorphous magnetic wire and the detection coil covers the feedback coil may be used. An inductance L of such a coil is expressed by the following equation.

$$L = \mu 0 \times S \times N2 / l$$

($\mu 0$: magnetic permeability of vacuum, S: cross-sectional area of air core coil, N: number of turns of coil, l: length of coil)

Since the feedback coil is formed in the detection coil of the magnetic impedance element, the radius of the feedback coil can be reduced. For this reason, the inductance can be reduced. Since the resonance point caused by the inductance and the parasitic capacitance of the coil can be set in a high frequency region, the high frequency characteristic can be improved.

In the present embodiment, an amorphous magnetic wire is used as the magnetic impedance element, but the magnetic impedance element is not limited thereto. For example, as the magnetic impedance element, an amorphous magnetic ribbon formed in a band shape may be used. The magnetic impedance element may be an element which has a soft magnetic thin film formed on a silicon substrate or the like.

A high-frequency sine-wave current or a pulse current may be supplied to the amorphous magnetic wire of the magnetic impedance element by a drive circuit. By supplying a pulse current whose duty ratio has been adjusted by the drive circuit, low power consumption can be achieved. If the pulse current is supplied, synchronous detection of the analog switch is changed in the same way, and adjusted so as to obtain a pulse output signal.

The magnetic impedance element in the present embodiment is different from CT (Current Transformer) in that no magnetic closed loop is formed.

In the present embodiment, an amorphous magnetic wire having a magnetic anisotropy in a circumferential direction is used as the magnetic impedance element. However, a high permeability magnetic wire such as permalloy may be used as the magnetic impedance element. The magnetic impedance element is made highly sensitive by a magnetic wire to which a magnetic anisotropy is induced preliminarily in the circumferential direction. However, it may be magnetized in the circumferential direction by supplying a direct current using a permalloy wire which is a magnetic wire of high magnetic permeability to which a magnetic anisotropy is not induced in the circumferential direction. Versatility can be improved by using the permalloy wire.

Figure 15:
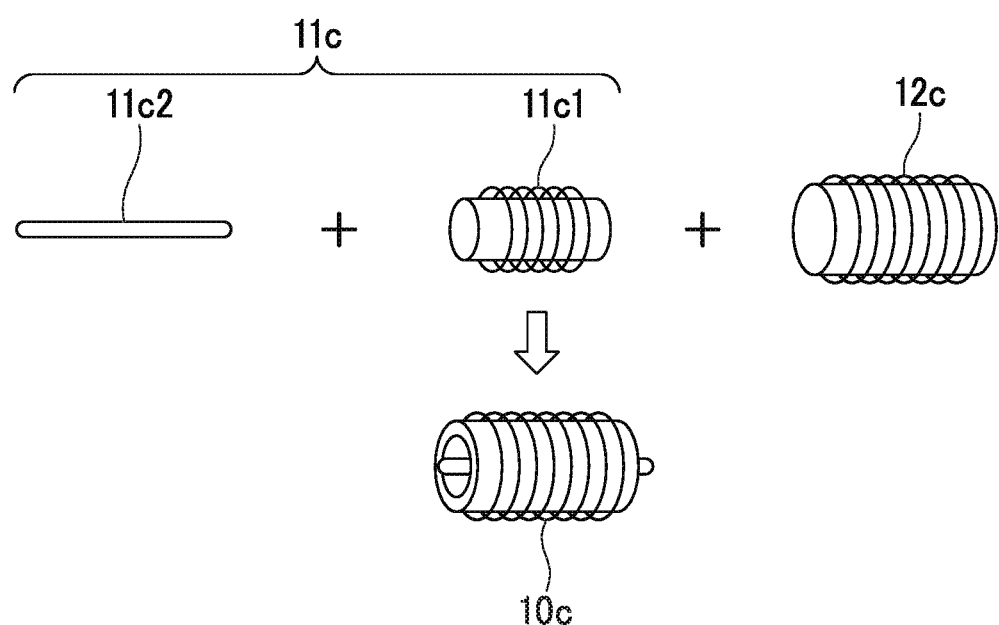
FIG. 15 is a drawing illustrating an example of the configuration of the current sensor in the fifth embodiment.

Next, with reference to FIG. 15, the configuration of the current sensor in the fifth embodiment will be described. FIG. 15 is a drawing illustrating an example of the configuration of the current sensor in the fifth embodiment.

As shown in FIG. 15, the composite sensor 10c includes an MI sensor 11c and a high frequency measurement coil 12c. The MI sensor 11c has an amorphous magnetic wire 11c2 and a detection coil 11c1. A magnetism sensing direction of the MI sensor 11c is the same as a magnetism sensing direction of the high frequency measurement coil 12c. The high frequency measurement coil 12c is disposed to cover the MI sensor 11c. Due to the rotation of the magnetic moment in the circumferential direction of the amorphous magnetic wire 11c2, a magnetic moment component which changes in the axial direction of the amorphous magnetic wire 11c2 at an energization frequency is generated in the detection coil 11c1. The magnetic moment component is detected by the detection coil 11c1, the drive frequency component is removed by a detection circuit using an analog switch in the MI sensor circuit 31c, and an external magnetic field is detected as a voltage signal. Thereby, the intensity of the current to be measured can be measured.

Specifically, the high frequency measurement coil 12c is formed by winding a conductive wire in a coil shape around a hollow cylindrical insulator having an inner diameter close to the outer shape of the MI sensor 11c. The conductive wire wound in a coil shape may be fixed by an adhesive, and it may be used in a state that the cylindrical insulator is pulled out. When a current flows via the limiting resistor 322c shown in FIG. 14 to the high frequency measurement coil 12c, the high frequency measurement coil 12c can make a direction of the magnetic field generated in the high frequency measurement coil 12c be parallel to a direction of the magnetic field applied to the MI sensor 11c. The negative feedback circuit 32c controls the intensity of the current flowing through the limiting resistor 322c to the high frequency measurement coil 12c in accordance with the magnetic field applied to the MI sensor 11c (in other words, an output from the MI sensor 11c) so that the high frequency measurement coil 12c operates as a feedback coil that cancels the magnetic field applied to the MI sensor 11c by applying a magnetic field in an opposite direction generated in the high frequency measurement coil 12c.

Sixth Embodiment

Figure 16:
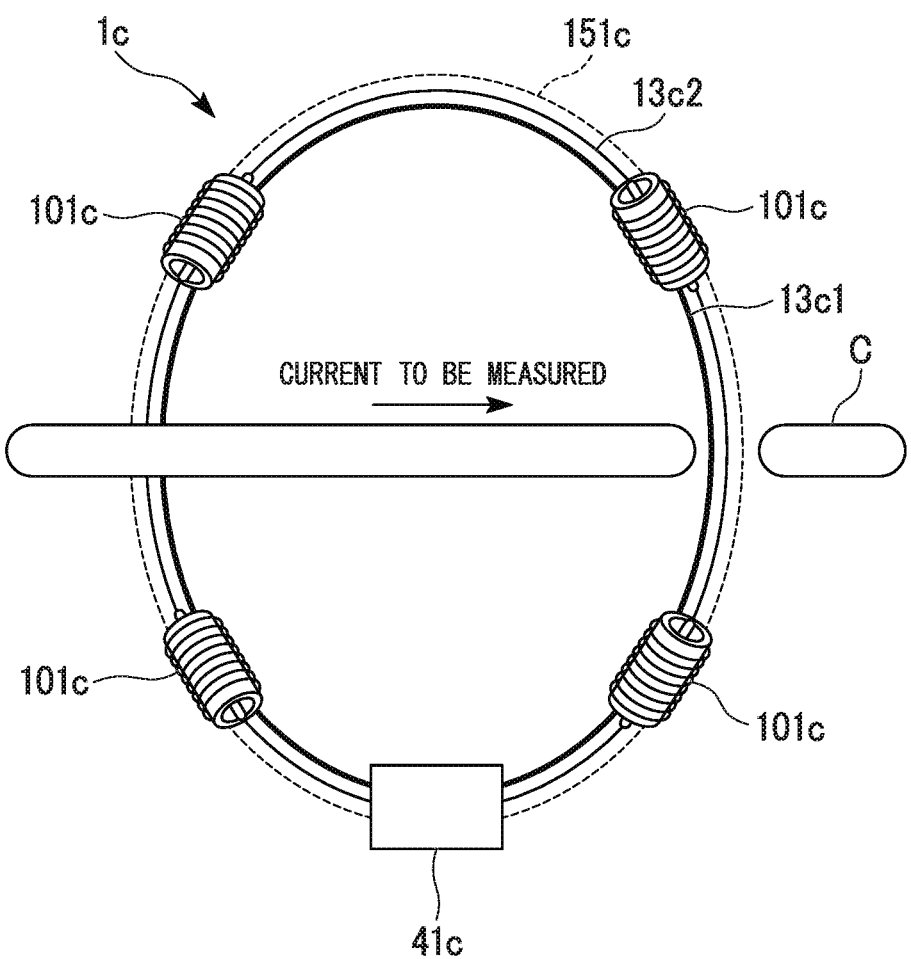
FIG. 16 is a drawing illustrating an example of the configuration of the current measurement device in the sixth embodiment.

Next, with reference to FIG. 16, the configuration of the current measurement device in the sixth embodiment will be described. FIG. 16 is a drawing illustrating an example of the configuration of the current measurement device in the sixth embodiment. The current measurement device in the sixth embodiment uses a current sensor in which a plurality of composite sensors 10c shown in the fifth embodiment is disposed.

In FIG. 16, the current sensor 1c is another embodiment of the current sensor 1c described in FIG. 14. In FIG. 16, since the configuration other than the current sensor 1c in FIG. 14 is similar, only the current sensor 1c and the connector 41c are illustrated and the others are omitted. In FIG. 16, parts that correspond to those in FIG. 14 are assigned the same reference numerals, and the descriptions thereof will be omitted.

In FIG. 16, the current sensor 1c has a composite sensor 101c, a composite sensor 102c, a composite sensor 103c, a composite sensor 104c, a detection coil wire 13c1, a magnetic sensor drive wire 13c2, and a high frequency measurement coil wire 151c. The composite sensor 101c, the composite sensor 102c, the composite sensor 103c, the composite sensor 104c, the detection coil wire 13c1, the magnetic sensor drive wire 13c2, and the high frequency measurement coil wire 151c are loop-shaped wire portions.

Since the composite sensor group (the composite sensor 101c, the composite sensor 102c, the composite sensor 103c, and the composite sensor 104c) is disposed around the wire portion in the current sensor 1c, it is possible to reduce an influence of a variation of the intensity of the magnetic field corresponding to a variation of the distance between the composite sensor and the conductor c. Even if a plurality of sets of the composite sensors is disposed, the wire portion is flexible. Therefore, even if the installation space around the conductor c is limited, the current sensor 1c can easily be wound around the conductor c and installed.

As described above, the current measurement device in the present embodiment includes a low frequency measurement sensor configured to measure a magnetic field generated by a current to be measured, and a high frequency measurement sensor configured to measure the magnetic field, a magnetism sensing direction of the low frequency measurement sensor and a magnetism sensing direction of the high frequency measurement sensor being substantially parallel to each other. The high frequency measurement sensor is configured to generate a magnetic field for canceling the magnetic field applied to the low frequency measurement sensor based on a current generated in accordance with the intensity of the magnetic field measured by the low frequency measurement sensor. Thereby, the current measurement device in the present embodiment can be used in a place where installation space is limited and can measure currents over a wide range of frequency.

In the present embodiment, a type of an element used for the low frequency measurement sensor is not limited to the above-described element. For example, a Hall element can be used as the element used for the low frequency measurement sensor. The Hall element is a sensor which utilizes a Hall effect. The Hall effect is a phenomenon in which when a voltage or a current is supplied to a semiconductor thin film to apply a magnetic field in a direction perpendicular to the surface thereof, since a distribution of electrons in the semiconductor thin film is biased due to Lorentz force, a voltage in a direction of a vector product of both the current and the magnetic field is generated. When a current or a voltage is supplied between input terminals and an external magnetic field is applied in a direction perpendicular to the surface, an output voltage signal proportional to the external magnetic field is detected between output terminals orthogonal to the input terminals.

An example of operation when a Hall element is used is shown. A drive circuit applies a current or a voltage between input terminals of the Hall sensor, an output of the Hall sensor is negatively fed back as a current to the feedback coil, the applied magnetic field to the Hall element is controlled to be zero (zero flux), and the current flowing through the feedback coil is output as an output signal. Thereby, even if the high frequency measurement coil is used as the feedback coil, it is possible to combine the frequency characteristics easily, and the frequency characteristic is improved. As the Hall element, a horizontal-type Hall element which detects a magnetic field component in a direction perpendicular to the surface is used, but it is not limited thereto. For example, as the Hall element, a vertical-type Hall element which detects a magnetic field component in a direction parallel to the surface may be used.

Further, a flux gate element may be used as an element used for the low frequency measurement sensor. The flux gate element may be a parallel-type flux gate element (a magnetic field to be measured is the same direction as a drive magnetic field), and may be an orthogonal-type flux gate element (a magnetic field to be measured is orthogonal to a drive magnetic field). The parallel type flux gate element is a sensor utilizing B (magnetic flux density)-H (magnetic field) characteristic of a high permeability magnetic core. For example, the parallel type flux gate element has a high permeability magnetic core having a large inclination (permeability) near an origin in a B-H diagram, a drive coil for applying an alternating magnetic field to the magnetic core, and a pickup coil for detecting an external magnetic field modulated by the drive coil.

In a single core-type flux gate element using a single high permeability magnetic core, the high permeability magnetic core is excited to a saturation region with an alternating current by the drive coil, and the magnetic flux from the excited high permeability magnetic core is detected by the pickup coil. In a state where no external magnetic field is applied, a waveform obtained from the flux gate element is symmetrical with respect to a time axis. In the state where an external magnetic field is applied, when a magnetic flux in the same direction as the direction of applying the external magnetic field is detected by the pickup coil, the saturation time becomes long because the magnetic flux in the magnetic core is added. In the case where a magnetic flux in a direction opposite to the direction of applying the external magnetic field is detected by the pickup coil, the saturation time is shortened because the magnetic flux in the magnetic core is subtracted. As a result, a waveform which is distorted and asymmetrical with respect to the time axis is obtained. A double frequency component of the excitation frequency is superimposed on the asymmetrical waveform, and the double frequency component is proportional to the external magnetic field. For this reason, by obtaining an amplitude value of the double frequency component using synchronous detection or the like, it becomes possible to detect the external magnetic field as a voltage signal.

The output of the flux gate element is negatively fed back as a current to the feedback coil, the magnetic field applied to the flux gate element is controlled to be zero (zero flux), and the current flowing through the feedback coil is output as an output signal. As a result hysteresis and magnetic saturation can be avoided, and linearity and span are greatly improved. By using the high frequency measurement coil as the feedback coil, it is possible to combine them easily.

Here, as the flux gate element, a parallel-type flux gate element in which a magnetic field to be measured is the same direction as a drive magnetic field is used, but the present invention is not limited thereto. For example, if an orthogonal-type flux gate element in which a magnetic field to be measured is orthogonal to a drive magnetic field is used, the drive coil is unnecessary. A double frequency-type orthogonal flux gate element in which a direct current bias is not applied and the output becomes a double frequency of the drive frequency may be used. Alternatively, a basic wave form-type orthogonal flux gate element in which a direct current bias is applied and the output becomes the same frequency as the drive frequency may be used.

As the flux gate element, a differential-type flux gate element which cancels an excitation component caused by the drive coil with a two-core configuration may be used instead of using the single core-type flux gate element. As the high permeability magnetic core, a ring core-type flux gate element using a ring core may be used.

For example, one or more programs for implementing the functions of the device described in the present embodiment may be stored in a non-transitory computer readable storage medium, and the one or more programs stored in the non-transitory computer readable storage medium may be read and executed by a computer system to perform the above-described various kinds of processes of the present embodiments. The "computer system" may include hardware, such as an OS and a peripheral device. If the "computer system" uses a WWW system, the "computer system" also includes a homepage providing environment (or a displaying environment). The "non-transitory computer readable storage medium" is a storage device, such as a flexible disk, a magneto-optical disk, a ROM, a writable nonvolatile memory such as a flash memory, a portable medium such as a CD-ROM, and a hard disk drive built in the computer system.

Furthermore, similar to a volatile memory (for example, DRAM (Dynamic Random Access Memory)) in the computer system used as a server or a client when the program is transmitted through a network such as the Internet or a communication line such as a telephone line, the "non-transitory computer readable storage medium" includes a memory holding the program for a predetermined period. The program may be transmitted from the computer system storing the program in a storage device to another computer system, through a transmission medium or by a transmission wave in the transmission medium. Here, the "transmission medium" which transmits the program is a medium which has a function of transmitting information, similar to a network (communication network) such as the Internet, and a communication line such as a telephone line. The program may be for implementing a part of the function described above. Furthermore, the function described above may be implemented in combination with a program which has already stored in the computer system, or may be a so-called patch file (differential program).

As used herein, the following directional terms "front, back, above, downward, right, left, vertical, horizontal, below, transverse, row and column" as well as any other similar directional terms refer to those instructions of a device equipped with the present invention. Accordingly, these terms, as utilized to describe the present invention should be interpreted relative to a device equipped with the present invention.

The term "configured" is used to describe a component, unit or part of a device includes hardware and/or software that is constructed and/or programmed to carry out the desired function.

Moreover, terms that are expressed as "means-plus function" in the claims should include any structure that can be utilized to carry out the function of that part of the present invention.

The term "unit" is used to describe a component, unit or part of a hardware and/or software that is constructed and/or programmed to carry out the desired function. Typical examples of the hardware may include, but are not limited to, a device and a circuit.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A current measurement device comprising:
a low frequency measurement sensor configured to measure a magnetic field generated by a current to be measured;
a high frequency measurement sensor configured to measure the magnetic field and configured to generate a magnetic field for canceling the magnetic field applied to the low frequency measurement sensor, a magnetism sensing direction of the low frequency measurement sensor and a magnetism sensing direction of the high frequency measurement sensor being substantially parallel to each other;

a negative feedback circuit configured to control a current flowing through the high frequency measurement sensor based on the magnetic field measured by the low frequency measurement sensor, the negative feedback circuit comprising:

a low pass filter configured to adjust a frequency characteristic of the current flowing through the high frequency measurement sensor and controlled by the negative feedback circuit; and an outputter configured to output a measurement value of the current to be measured based on the current flowing through the high frequency measurement sensor, wherein the high frequency measurement sensor is connected to a first wire which is loop-shaped, wherein the low frequency measurement sensor is connected to a second wire which is loop-shaped, and wherein the negative feedback circuit is configured to receive an output signal from the low frequency measurement sensor via the second wire, and configured to supply a current corresponding to the output signal to the high frequency measurement sensor via the first wire.

2. The current measurement device according to claim 1, wherein the high frequency measurement sensor covers the low frequency measurement sensor.

3. The current measurement device according to claim 1, wherein the high frequency measurement sensor comprises a coil.

4. The current measurement device according to claim 1, wherein a plurality of sets of the low frequency measurement sensor and the high frequency measurement sensor is connected to the first wire and the second wire.

5. The current measurement device according to claim 1, wherein the high frequency measurement sensor is a sensor in which a conductive wire is wound in a coil shape around a hollow cylindrical insulator.

6. The current measurement device according to claim 1, wherein the low frequency measurement sensor comprises a high sensitivity magnetic resistance sensor and a low sensitivity magnetic resistance sensor, wherein the high sensitivity magnetic resistance sensor is arranged in parallel to the low sensitivity magnetic resistance sensor, and wherein a magnetism sensing direction of the high sensitivity magnetic resistance sensor is the same as a magnetism sensing direction of the low sensitivity magnetic resistance sensor.

7. The current measurement device according to claim 1, wherein the low frequency measurement sensor is a horizontal-type Hall element which detects a magnetic field component in a direction perpendicular to a surface of the low frequency measurement sensor.

8. The current measurement device according to claim 1, wherein the low frequency measurement sensor is a vertical-type Hall element which detects a magnetic field component in a direction parallel to a surface of the low frequency measurement sensor.

9. The current measurement device according to claim 1, wherein the low frequency measurement sensor comprises a parallel-type flux gate element of which drive magnetic field is the same direction as a magnetic field to be measured.

10. The current measurement device according to claim 1, wherein the low frequency measurement sensor comprises an orthogonal-type flux gate element of which drive magnetic field is orthogonal to a magnetic field to be measured.

11. The current measurement device according to claim 1, wherein the low frequency measurement sensor is a magnetic impedance sensor which comprises a magnetic impedance element and a detection coil for detecting a magnetic impedance effect of the magnetic impedance element.

12. The current measurement device according to claim 11, wherein the magnetic impedance element is an amorphous magnetic wire which has a magnetic anisotropy in a circumferential direction.

13. The current measurement device according to claim 11, wherein the magnetic impedance element is an element which has a soft magnetic thin film formed on a silicon substrate.

* * * * *